United States Patent
Park

(10) Patent No.: US 8,536,040 B1
(45) Date of Patent: Sep. 17, 2013

(54) TECHNIQUES FOR USING MATERIAL SUBSTITUTION PROCESSES TO FORM REPLACEMENT METAL GATE ELECTRODES OF SEMICONDUCTOR DEVICES WITH SELF-ALIGNED CONTACTS

(75) Inventor: Chang Seo Park, Clifton Park, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 11 days.

(21) Appl. No.: 13/438,394

(22) Filed: Apr. 3, 2012

(51) Int. Cl.
*H01L 29/66* (2006.01)

(52) U.S. Cl.
USPC .................................. 438/592; 257/E21.198

(58) Field of Classification Search
USPC ................. 438/592, FOR. 193; 257/E21.198
See application file for complete search history.

(56) References Cited

U.S. PATENT DOCUMENTS

| | | | | |
|---|---|---|---|---|
| 6,911,365 B2 * | 6/2005 | Nakamura | ..................... | 438/255 |
| 8,431,472 B2 * | 4/2013 | Park | .............................. | 438/591 |
| 2008/0128762 A1 * | 6/2008 | Vora | .............................. | 257/288 |

OTHER PUBLICATIONS

Park et al., "Substituted Aluminum Metal Gate on High-K Dielectric for Low Work-Function and Fermi-Level Pinning Free," 2004 IEEE.

* cited by examiner

*Primary Examiner* — George Fourson, III
(74) *Attorney, Agent, or Firm* — Williams, Morgan & Amerson, P.C.

(57) ABSTRACT

Generally, the present disclosure is directed to techniques for using material substitution processes to form replacement metal gate electrodes, and for forming self-aligned contacts to semiconductor devices made up of the same. One illustrative method disclosed herein includes removing at least a dummy gate electrode to define a gate cavity, forming a work-function material in said gate cavity, forming a semiconductor material above said work-function material, and performing a material substitution process on said semiconductor material to substitute a replacement material for at least a portion of said semiconductor material.

27 Claims, 19 Drawing Sheets

TECHNIQUES FOR USING MATERIAL SUBSTITUTION PROCESSES TO FORM REPLACEMENT METAL GATE ELECTRODES OF SEMICONDUCTOR DEVICES WITH SELF-ALIGNED CONTACTS

BACKGROUND OF THE INVENTION

1. Field of the Invention

Generally, the present invention relates to sophisticated integrated circuits, and, more particularly, to techniques for using material substitution processes to form replacement metal gate electrodes, and for forming self-aligned contacts to semiconductor devices made up of the same.

2. Description of the Related Art

The fabrication of advanced integrated circuits, such as CPU's, storage devices, ASIC's (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

For many device technology generations, the gate structures of most transistor elements has comprised silicon-based materials, such as a silicon dioxide and/or silicon oxynitride gate dielectric layer, in combination with a polysilicon gate electrode. However, as the channel length of aggressively scaled transistor elements has become increasingly smaller, many newer generation devices have turned to gate electrode stacks comprising alternative materials in an effort to avoid the short-channel effects which may be associated with the use of traditional silicon-based materials in reduced channel length transistors. For example, in some aggressively scaled transistor elements, which may have channel lengths of 14-32 nm, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate dielectric layer of an HK/MG gate structure. For example, in some transistor element designs, a high-k gate dielectric layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), and the like. Furthermore, a metal material layer made up of one or more of a plurality of different non-polysilicon metal gate electrode materials may be formed above the high-k gate dielectric layer in HK/MG configurations so as to control the work function of the transistor, which is sometimes referred to as a work-function material, or a work-function material layer. These work-function materials may include, for example, titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), and the like.

One conventional processing method that is commonly used for forming high-k/metal gate transistor elements is the so-called "gate last" or "replacement gate" technique, wherein initial device processing steps are performed using a "dummy" gate electrode. The term "dummy" gate electrode refers to a process sequence wherein a gate structure that is formed during an early manufacturing stage does not ultimately form a part of the finished semiconductor device, but is instead removed and replaced with an HK/MG replacement gate electrode during a later manufacturing stage. Typically, a "dummy" gate electrode is based on a conventional semiconductor materials and device processing steps, such as, for example, a polysilicon gate architecture and the like. However, due to the overall aggressive scaling of modern semiconductor devices, a variety of problems may occur during device processing that is based on the so-called replacement metal gate (RMG) technique, which can sometimes lead to device defects and/or reduced device reliability. Some of these problems are illustrated in FIGS. 1a-1h and will now be described in further detail below.

FIG. 1a schematically depicts a semiconductor device 100 during a later stage of device processing based on one illustrative prior art RMG technique. The semiconductor device 100 includes transistor elements 150A, 150B formed in and above a semiconductor layer 102 of a substrate 101. As shown in FIG. 1a, the transistor elements 150A, 150B are made up of, among other things, gate structures 110, each of which may include a dummy gate dielectric layer 104 (such as a silicon dioxide or oxynitride material), a dummy gate electrode 105 (such as amorphous silicon or polysilicon material), and sidewall spacer structures 106 (such as a silicon nitride material). It should be appreciated that, depending on the overall device processing requirements, the sidewall spacer structures 106 may be single spacer elements (as schematically depicted in FIG. 1a), or may include a plurality of spacer elements (not shown), such as liner layers, offset spacers, and the like, which are used as mask layers so as to form source/drain regions 102d have been formed in the semiconductor layer 102 based on implantation techniques well known in the art. Furthermore, a first layer portion 103a of an interlayer dielectric material 103 (see, FIG. 1f), such as a silicon dioxide material and the like, is formed above the source/drain regions 102d of the semiconductor layer 102, surrounding the gate structures 110 so as to electrically isolate the transistor elements 150A, 150B, and thereafter planarized so as to expose the upper surface 105s of the dummy gate electrode 105.

In the manufacturing stage of the RMG technique shown in FIG. 1a, the semiconductor device 100 is exposed to a suitably designed multi-step etch process 130 that is first adapted to selectively remove the dummy gate electrodes 105 from the gate structures 110 relative to the sidewall spacer structures 106 and the dummy gate dielectric layers 104. The etch recipe of the etch process 130 may thereafter be adjusted so as to selectively remove any remaining portion of dummy gate dielectric layers 104 from above the channel regions 102c of the respective transistor elements 150A and 150B, thereby forming gate openings or cavities (not shown) between the sidewall spacer structures 106 and above the channel regions 102c in which replacement metal gate electrodes may be formed during later processing steps.

FIG. 1b schematically depicts the semiconductor device 100 after completion of the etch process 130, and after further processing steps of the prior art RMG technique have been performed. As shown in FIG. 1b, a deposition sequence 131 has been performed to form a layer of high-k dielectric material 107 above both transistor elements 150A, 150B—i.e., above the first layer portion 103a, along the inside of the sidewall structures 106, and above the channel region 102c. Furthermore, the deposition parameters of deposition sequence 131 are adjusted so as to thereafter form a layer of work-function material 108 above the high-k dielectric material 107, thereby forming reduced-sized gate cavities 120 having a gap width 120w and a depth 120d.

As shown in FIG. 1c, a further material deposition process 132 is then performed so as to deposit a layer of conductive metal 109 above both transistor elements 150A, 150B, and so as to fill the reduced-sized gate cavities 120. In a typical prior art process, the deposition process 132 is, for example, a chemical vapor deposition (CVD) process, and the layer of conductive metal 109 is, for example, aluminum. However, as may be appreciated by those of ordinary skill, as transistor devices are more aggressively scaled, and the critical dimensions of those devices (such as gate length and the like) are decreased, the aspect ratio of the reduced-sized gate cavities 120 (i.e., the ratio of the depth 120d to the gap width 120w) greatly increases. Furthermore, the higher aspect ratio of the reduced-sized gate cavities 120 may substantially increase the likelihood that voids 109v may inadvertently be created in the layer of conductive metal 109 used to fill the reduced-sized gate cavities 120 during the material deposition process 132, which may lead to increased resistivity of the resulting metal gate electrodes, as well as a variation in resistivity within a group of gate electrodes. Moreover, the likelihood that voids 109v may be created in the reduced-sized gate cavities 120 increases when the deposition process 132 a CVD process, and when it is used to form a layer of conductive material 109 that comprises aluminum.

In some prior art processes, the gap-fill capabilities of the deposition process 132 used to form the layer of conductive metal 109 may be enhanced by first forming a thin metal liner, or wetting layer 109w (as shown in FIG. 1d), so as to facilitate a more uniform deposition of the conductive metal 109, thus reducing the likelihood that voids 109v may be formed. In general, the material of the wetting layer 109w may be varied depending on the material used for the layer of conductive metal 109. As noted above, in many conventional RMG techniques, aluminum is used for the layer of conductive metal 109, and the most common material used for a wetting layer 109w with an aluminum conductive metal 109 is titanium. However, depending on the overall device processing parameters and the specific materials used, the materials of the layer of conductive metal 109 and the wetting layer 109w may sometimes combine to form metal alloy regions 109r. Such alloy regions 109r may have an increased resistivity, thereby potentially leading to increased resistivity variations between metal gate electrodes. Furthermore, the presence of the metal alloy regions 109r may also induce a non-uniform planarizing effect during a planarization processes 133, such as a chemical mechanical polishing (CMP) process and the like, that may be used during later processing steps to remove excess material of the replacement metal gate material layers 107, 108 and/or 109. Furthermore, additional voids 109v may even be created as a result of the presence of a metal alloy region 109r at or near the upper surface of the finished metal gate structures 110, which can possibly be physically pulled out of the conductive metal layer 109 during the planarization process 133, as shown in FIG. 1e.

Another problem associated with at least some of the prior art RMG processes is related to the contact elements that are formed to provide electrical connections between a first metallization layer (M1) of the semiconductor device 100 and the source/drain regions 102d of the transistor elements 150A, 150B. As a result of the continuous and aggressive scaling of transistor elements in the semiconductor industry, limitations on the overall capability of traditional photolithography techniques has generally led to the use borderless or self-aligned source/drain contact elements. However, due to the use of very tight gate electrode pitch dimensions 110p, which can be as little as 60 nm or even less as devices are further scaled down, alignment problems inevitably occur between a photoresist mask 125 that is used to pattern contact via openings 111 in the interlayer dielectric material 103 and the overall pattern or spacing of the replacement gate structures 110. Accordingly, as shown in FIG. 1f, the likelihood that a contact via opening 111 may expose both a source/drain region 102d and one or both of the work-function material 108 and the conductive metal 109 of the gate structures 110 increases greatly, a situation which may lead to the creation of a short between the source/drain region 102d and gate structure 110.

As shown in FIG. 1f, one prior art approach that has been used to address the contact alignment issue described above is to convert the metal in the upper portions 108u and 109u of the work-function material 108 and conductive metal 109, respectively, to dielectric materials by using one or more conventional oxidation, nitridization, and/or fluorination processes prior to completing the interlayer dielectric material 103 by forming a second layer portion 103b above the first layer portion 103a. This dielectric material conversion process serves to create a dielectric insulation layer 110d, thereby preventing an electrical contact from being made to the replacement gate structures 110 when a conductive contact element is eventually formed in the contact via opening 111. However, this approach may have some drawbacks, due to the fact that the typical replacement metal gate electrode stack is made up of multiple layers of different metal materials, each of which may respond differently to the various dielectric conversion processes listed above. For example, oxidation rates and minimum oxidation temperatures may vary between the each of the typical metal gate electrode materials, and it can be difficult to oxidize some materials, such as TiN and TaN, at a low enough temperature that does not significantly impact the overall thermal budget of the semiconductor device 100. Furthermore, some metal materials that may commonly be used for manufacturing metal gate electrodes, such as Ti and Ta, cannot be transformed into dielectric materials by nitridization. Additionally, it may also be difficult to achieve an adequate treatment depth when using fluorination processes, such that an acceptable cap layer thickness can ultimately be obtained.

FIGS. 1g-1i illustrate yet another prior art approach that has sometimes been utilized to address the above-noted contact element alignment issues. As shown in FIG. 1g, an etch process 134 is performed so as to form recesses 110r in the gate structures 110 by removing an upper portion of the work-function material 108 and the conductive metal 109. Thereafter, as shown in FIG. 1h, a dielectric material layer 112, such as, for example, a silicon nitride material and the like, is formed above the semiconductor device 100 so as to fill the recesses 110r, and thereby form cap layers 112a above the replacement gate structures 110. However, as illustrated in FIG. 1g, obtaining a uniform recess depth is problematic, again due to the presence of multiple layers of different metal materials, each having differing etch rate characteristics. Furthermore, the overall poor etch selectivity of the various metal gate electrode materials relative to the material of the first layer portion 103a of the interlayer dielectric material 103 may lead to an undesirable over-etching of the first layer portion 103a, thereby also forming undesirable recesses 103r in the first layer portion 103a. In such cases, it will also be necessary to form the dielectric cap layer 112 so as to fill the recesses 103r in the over-etched portions of the first layer portion 103a.

The dielectric cap layer 112 is then planarized, and the second layer portion 103b is formed above the dielectric cap layer 112b so as to complete the interlayer dielectric material 103. In many applications, the second layer portion is typically made up of substantially the same material as the first layer portion (e.g., silicon dioxide and the like), although other materials can be used. Accordingly, as shown in FIG. 1h, the interlayer dielectric material 103 is now made up of the material layers 103a, 112 and 103b, wherein the material of the first and second layer portions 103a, 103b (e.g., silicon dioxide) is different that of the dielectric cap layer 112 (e.g., silicon nitride).

Thereafter, when contact via openings 111 are formed in the interlayer dielectric material 103 so as to expose the source/drain regions 102d (see, FIG. 1i), it will be necessary to adjust the etch recipe of the etch process 134 so as to etch the different material layers (i.e., layers 103a, 112 and 103b) of the interlayer dielectric material 103. In the event the patterned mask layer 125 is inadvertently misaligned as previously described, such that the contact via openings 111 are positioned at least partly above the gate structures 110, a portion of the dielectric cap layer 112a formed in the recesses 110r—which is made up of the same material as the cap layer 112—will potentially be affected during that portion of the etch process 134 that is adapted to etch through the cap layer 112. In such cases an upper surface 110s of one or both of the metal gate electrode materials 108 and 109 of the gate structures 110 may also be exposed, which could again potentially lead to creating a short between the gate structures 110 and the source/drain regions 102d.

The present disclosure is directed to various methods that may avoid, or at least reduce, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the present disclosure is directed to techniques for using material substitution processes to form replacement metal gate electrodes, and for forming self-aligned contacts to semiconductor devices made up of the same. One illustrative method disclosed herein includes removing at least a dummy gate electrode to define a gate cavity, forming a work-function material in said gate cavity, forming a semiconductor material above said work-function material, and performing a material substitution process on said semiconductor material to substitute a replacement material for at least a portion of said semiconductor material.

Also disclosed herein is an illustrative method that includes forming a gate structure above an active area of a transistor device, the gate structure including at least a dummy gate electrode and a dummy gate dielectric layer. The disclosed method is further directed to, among other things, forming a gate cavity in the gate structure by removing the dummy gate electrode and the dummy gate dielectric layer, and forming a replacement gate structure by forming a high-k dielectric material inside of the opening and above a channel region of the transistor device, forming a work-function material above the high-k dielectric material, forming a semiconductor material above the work-function material, and performing a material substitution process on the semiconductor material to substitute a replacement metal gate electrode material for at least a portion of the semiconductor material formed inside of the gate cavity.

In another illustrative embodiment of the present disclosure, a method includes, among other things, forming a semiconductor device comprising a gate structure, the gate structure including a dummy gate electrode, a dummy gate dielectric layer, and sidewall spacers adjacent to sidewalls of the dummy gate electrode. Furthermore, the disclosed method includes selectively removing the dummy gate electrode and the dummy gate dielectric layer to form a gate cavity in the gate structure, and forming a high-k dielectric material inside of the gate cavity, the high-k dielectric material having a dielectric constant of approximately 10 or higher. Additionally, the illustrative method includes forming a work-function material inside of the gate cavity and above the high-k dielectric material, and forming a semiconductor material above the work-function material to fill a remaining portion of the gate cavity, the semiconductor material comprising silicon. Moreover, the disclosed method also includes performing a material substitution process on the semiconductor material to substitute a replacement gate electrode material for at least a portion of the semiconductor material formed in the opening.

BRIEF DESCRIPTION OF THE DRAWINGS

The disclosure may be understood by reference to the following description taken in conjunction with the accompanying drawings, in which like reference numerals identify like elements, and in which.

Figure 1A:
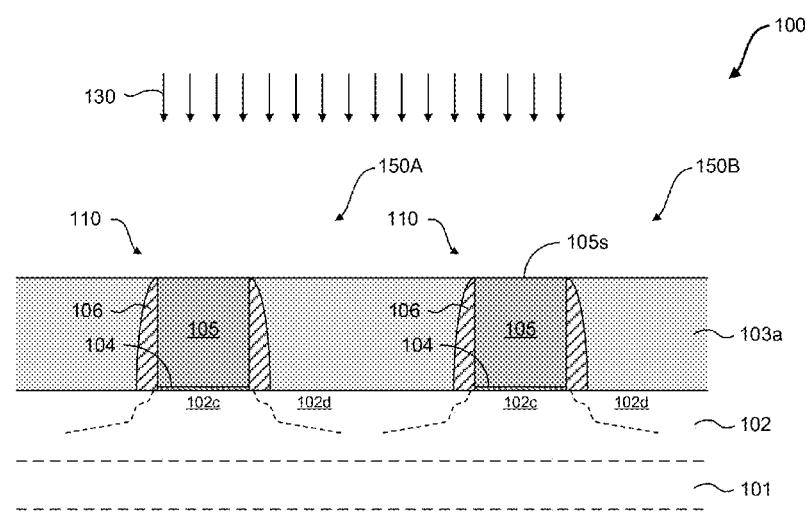
FIGS. 1a-1e schematically illustrate a representative prior art process flow for forming metal gate electrodes using a replacement metal gate technique.
Figure 1B:
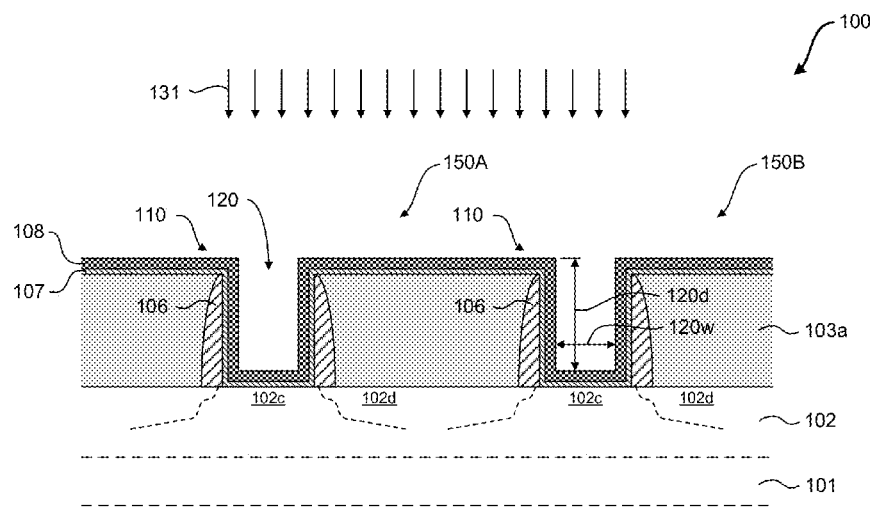
Figure 1C:
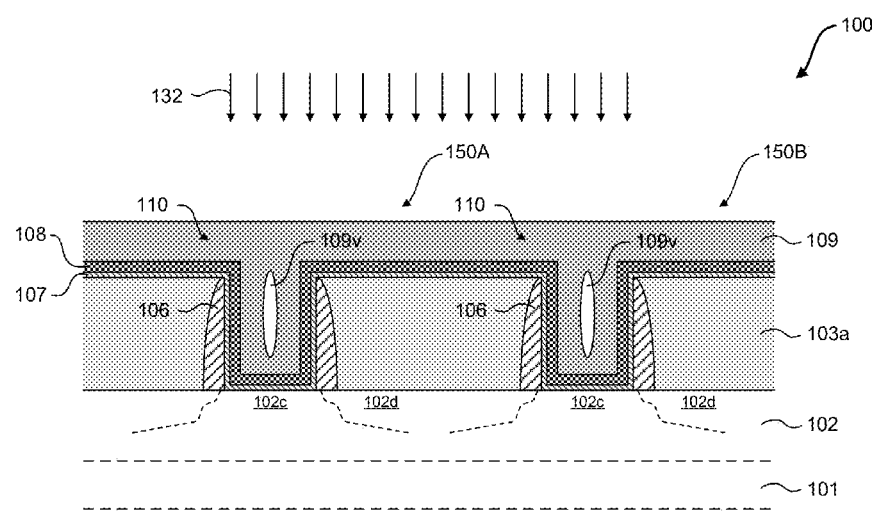
Figure 1D:
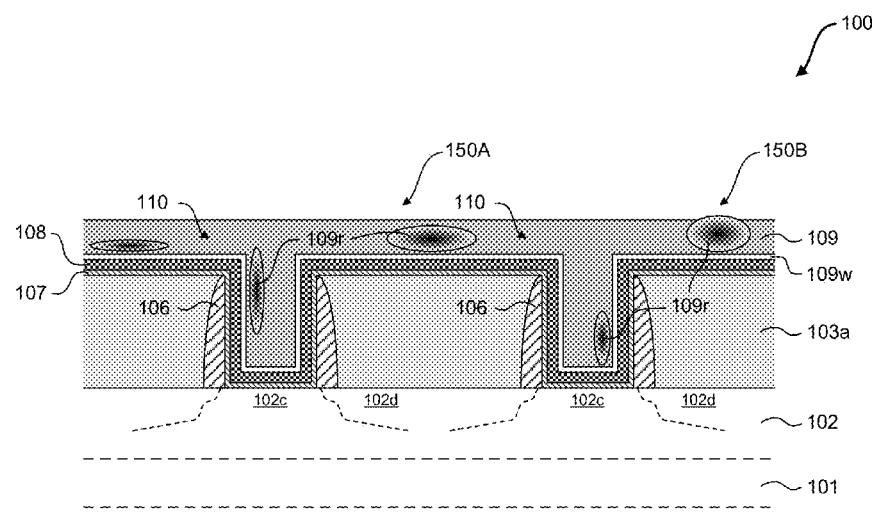
Figure 1E:
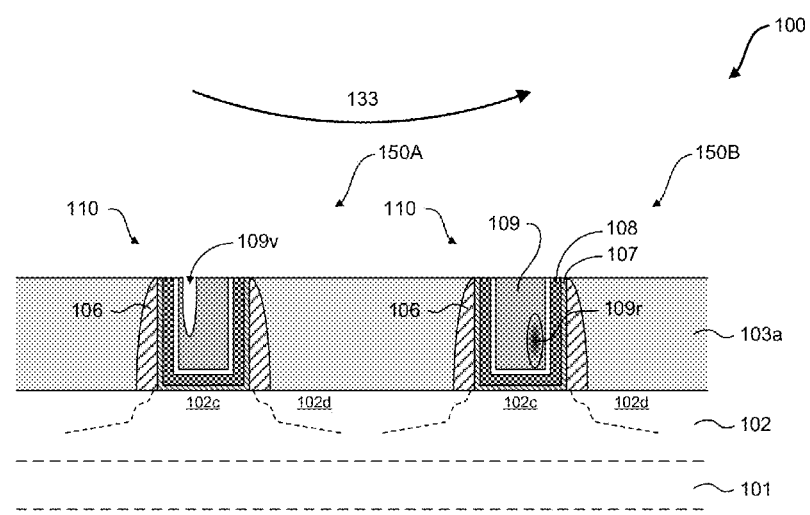
Figure 1F:
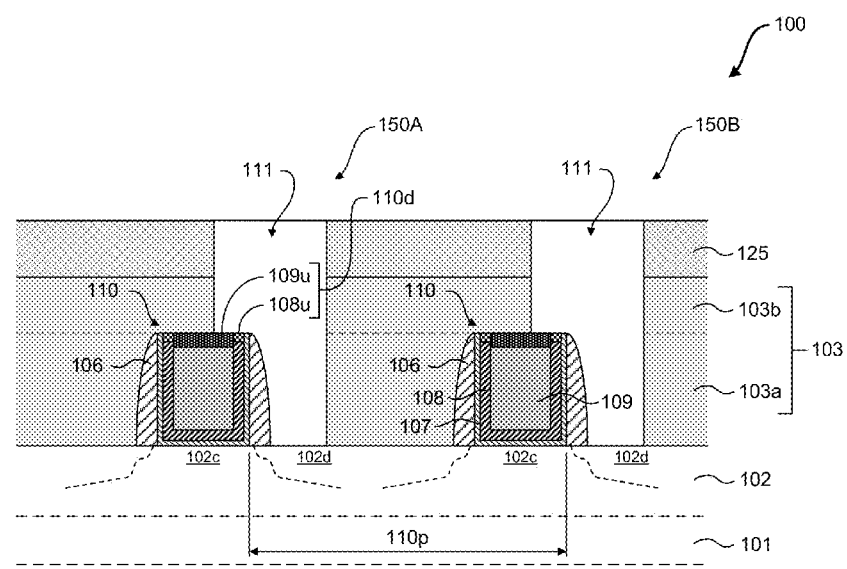
FIG. 1f schematically illustrates one representative prior art process flow for forming contact openings to transistor elements made up of metal gate structures.
Figure 1G:
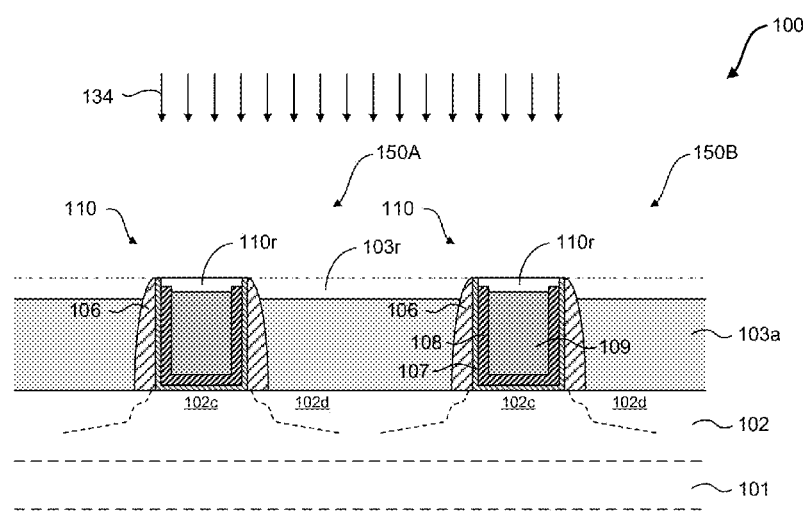
FIGS. 1g-1i schematically illustrate yet another prior art process flow for forming contact openings to transistor elements made up of metal gate structures.
Figure 1H:
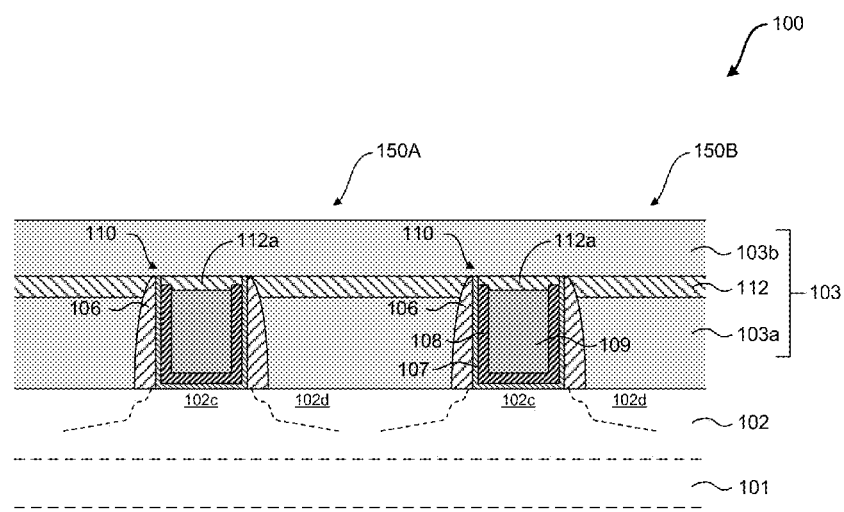
Figure 1I:
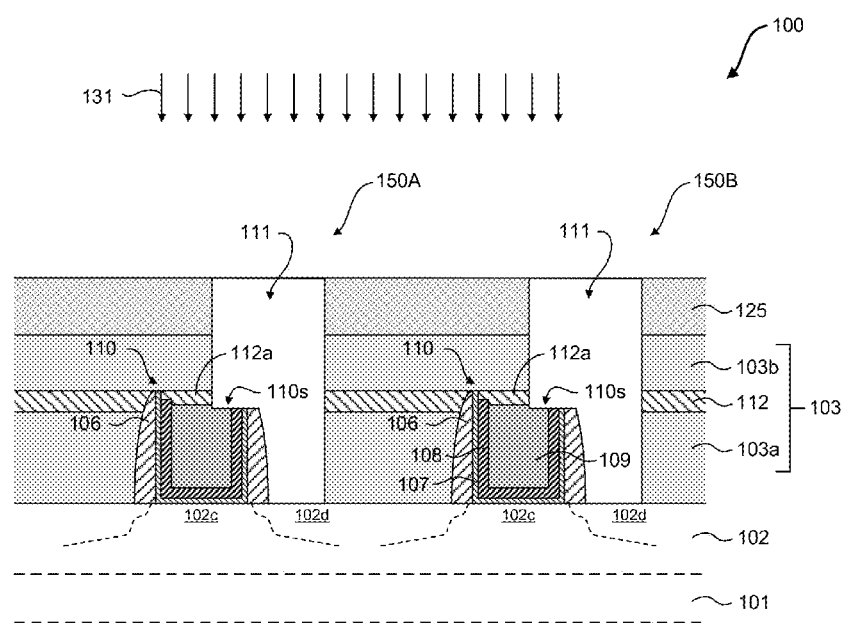

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter of the present disclosure is directed to, among other things, methods for using material substitution processes to form replacement metal gate electrodes, methods for forming self-aligned contacts to semiconductor devices made up of replacement metal gate electrodes, and the associated structures resulting therefrom. In certain illustrative embodiments, a material substitution process may be used to substitute a conductive metal material, such as aluminum or tungsten, for a semiconductor material, such as amorphous silicon or polysilicon. In still other embodiments disclosed herein, a dielectric cap layer may be formed above a replacement metal gate electrode, a portion of which may be exposed by a contact opening that is formed to a contact region of a transistor device that includes the replacement metal gate electrode.

In those illustrative embodiments wherein a material such as aluminum is substituted for a semiconductor material such as amorphous or polysilicon, the material substitution process may be based on a phenomenon that is sometimes referred to as aluminum spiking During a material substitution process that is based on aluminum spiking, a material layer that is substantially made up of aluminum is formed on a material layer that is substantially silicon, and the material layers are then exposed to a heat treatment process in a temperature range of approximately 375-450° C. In this temperature range, the solubility of silicon increases up to approximately 0.5%. Furthermore, the diffusivity of silicon along the grain-boundaries of aluminum in this temperature range is very high. As such, a significant quantity of silicon can move from the area below the aluminum-silicon interface—i.e., from the silicon material layer—up and into the aluminum layer. At the same time, aluminum material in the aluminum layer will move downward to fill the voids created by the departing silicon.

This aluminum spiking process can often occur when aluminum material layers are in direct contact with silicon material layers at sufficiently high temperature, but it generally occurs in a sporadic and non-uniform fashion. However, aluminum spiking can sometimes be made to be more consistent and uniform when an additional material layer, sometimes referred to as a trapping layer or an attraction layer, is formed above the aluminum. Generally, the trapping layer is of such a chemical nature that it acts to attract the silicon out of the aluminum, and which has an affinity for forming an alloy with the silicon, such as, for example, a metal silicide. Some materials that may be used for the trapping layer include, for example, refractory metals that may typically be used to form metal silicides, such as titanium, nickel, and the like. Accordingly, when exposed to the above-noted temperature range for a sufficient period of time, the silicon material layer may be completely replaced with—i.e., substituted by—a material layer that is substantially aluminum, provided there is a sufficient volume of aluminum material to take the place of the silicon material. Furthermore, a layer of a silicon material alloy—e.g., a metal silicide such as titanium silicide—will be present above the "substituted" aluminum, and a residual layer of trapping material—e.g., titanium—may be present above the metal silicide, provided there is a sufficient volume of the trapping material to alloy with all of the silicon material. Moreover, it should be appreciated that the length of time to which the material layers are exposed to the heat treatment process will generally be a function of the volume of the silicon material that will be replaced, or substituted, by the aluminum material.

In those illustrative embodiments of the present disclosure wherein a material such as tungsten is substituted for a semiconductor material such as silicon, the material substitution process may be based on the decomposition reaction of a gaseous tungsten compound, such as tungsten hexafluoride ($WF_6$) or tungsten hexachloride ($WCl_6$), when it comes into contact with silicon. For example, during the decomposition reaction of tungsten hexafluoride with silicon, tungsten material is deposited out, and a volatile gaseous silicon compound, such as silicon tetrafluoride ($SiF_4$, or tetrafluorosilane) or silicon difluoride ($SiF_2$), is released. This decomposition reaction is temperature dependent, so that the reaction rate increases as temperature increases. It should be appreciated, however, that while the amount of time required to completely substitute tungsten for silicon may decrease with an increased treatment temperature, there may be an impact on the overall thermal budget of a semiconductor device treated in this manner, due to the higher treatment temperature. Typically, treatment temperatures used for the decomposition reaction of a gaseous tungsten compound range from approximately 350-450° C., although other temperatures may also be used, depending on the overall thermal budget, as indicated above.

Figure 2A:
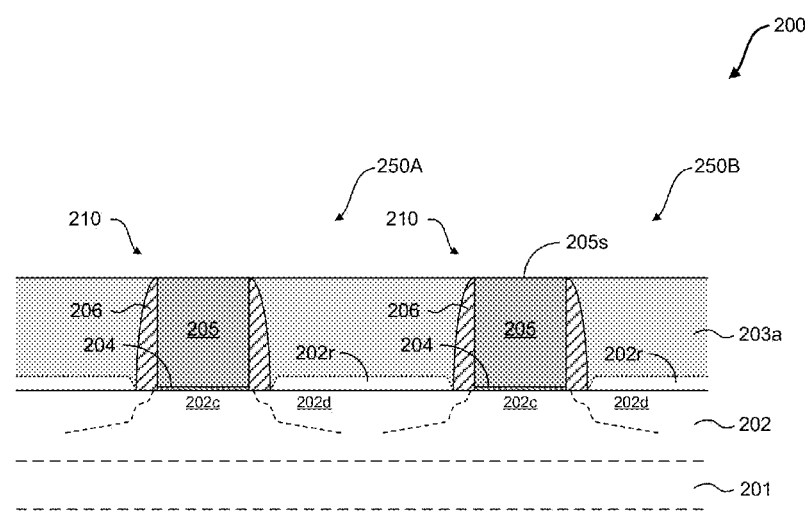
FIGS. 2a-2g schematically depict an illustrative technique for forming a replacement metal gate electrodes in accordance with one embodiment of the present disclosure.
Figure 2B:
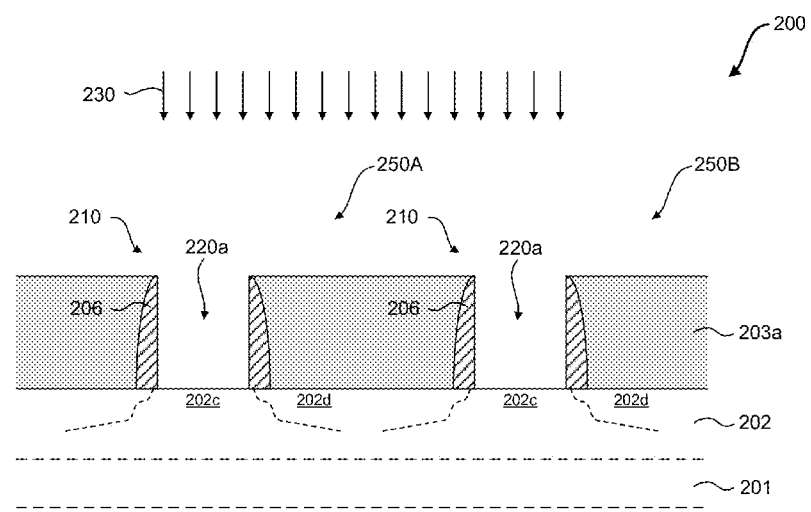
Figure 2C:
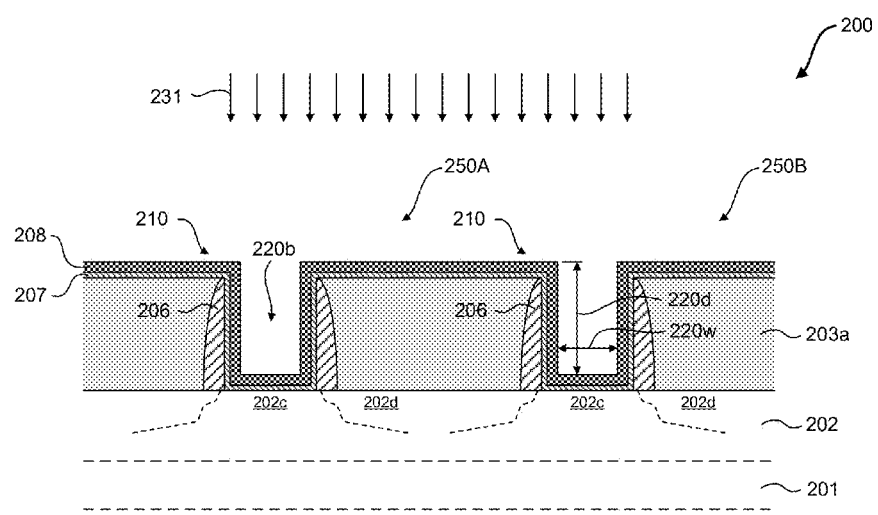
Figure 2D:
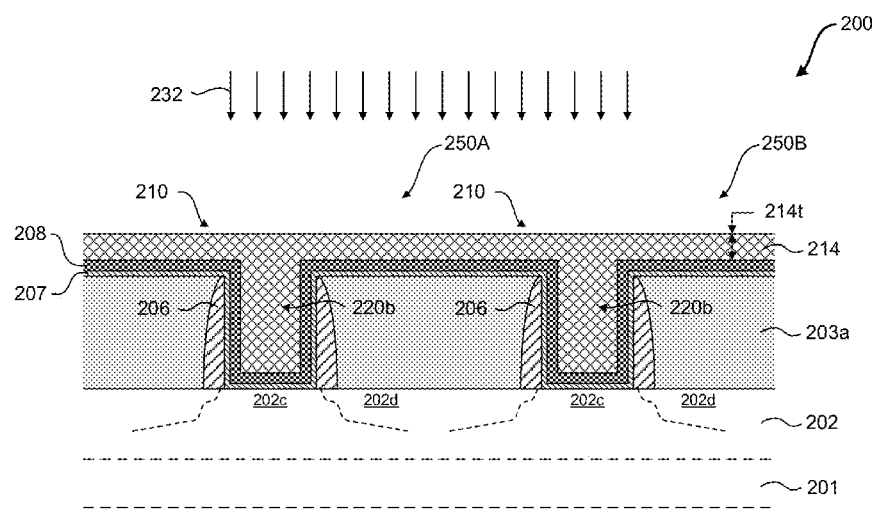
Figure 2E:
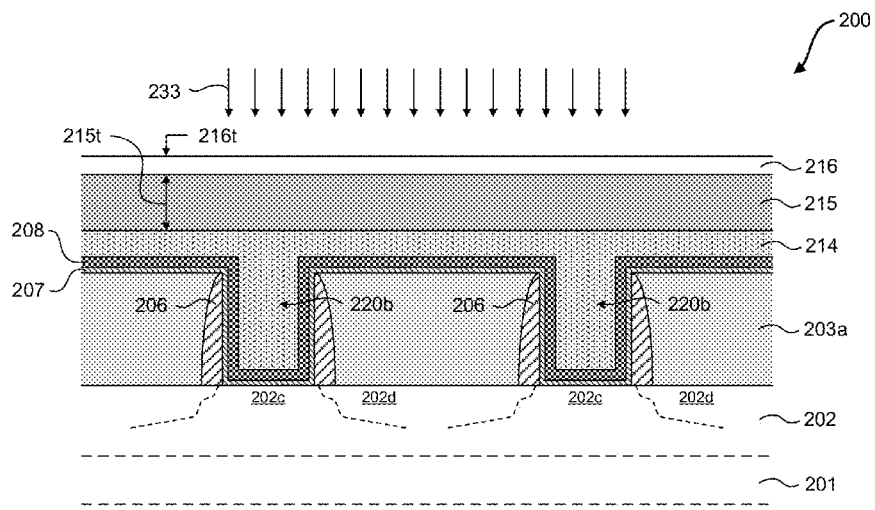
Figure 2F:
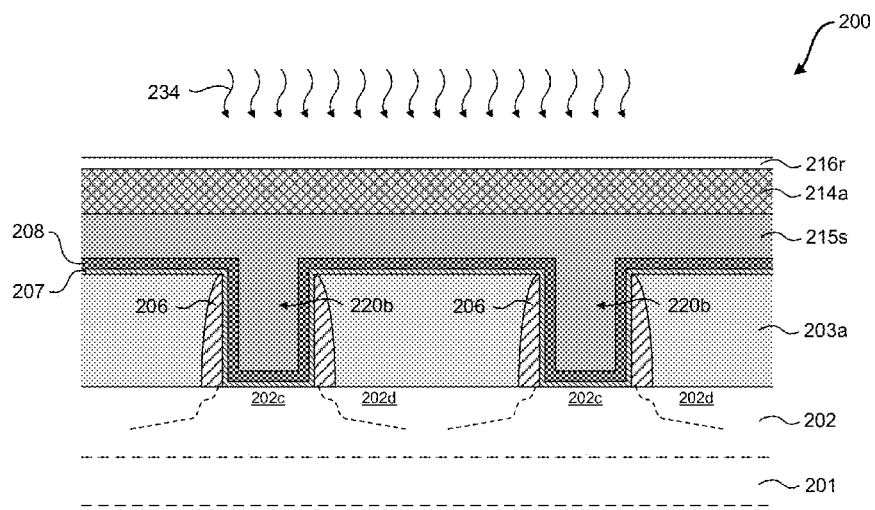
Figure 2G:
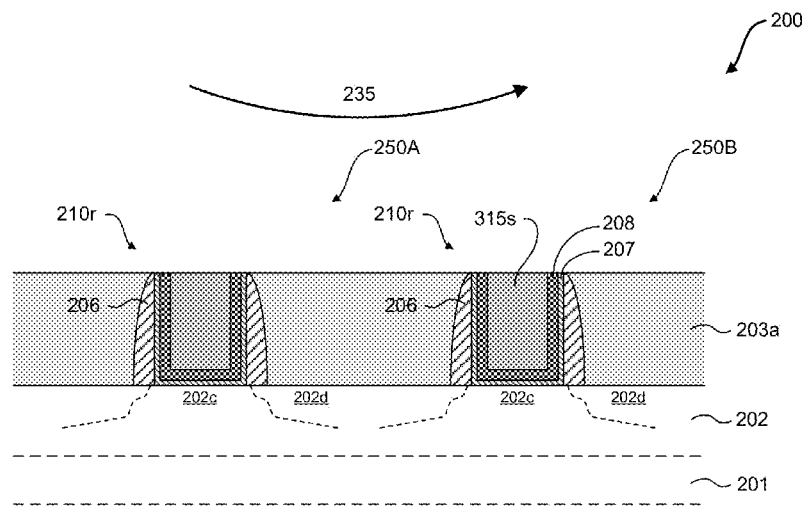
Figure 2H:
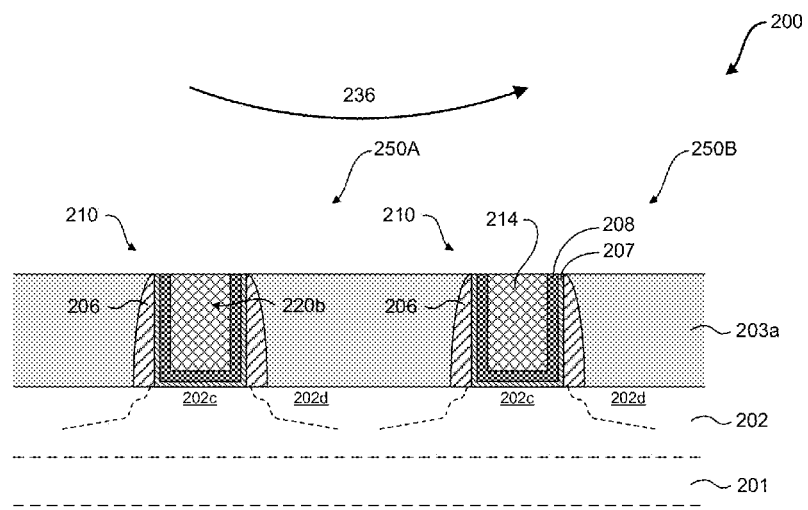
FIGS. 2h-2j schematically depict a technique that is used for forming a replacement metal gate electrodes in accordance with another illustrative embodiment of the present disclosure.
Figure 2I:
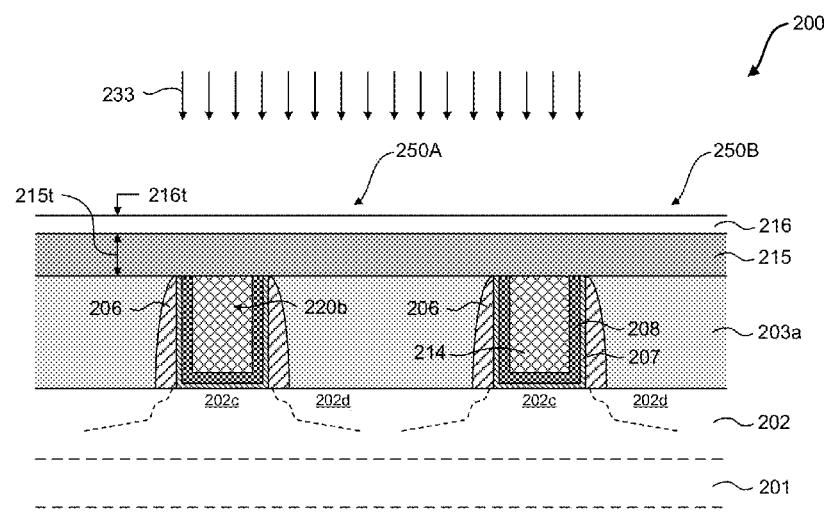
Figure 2J:
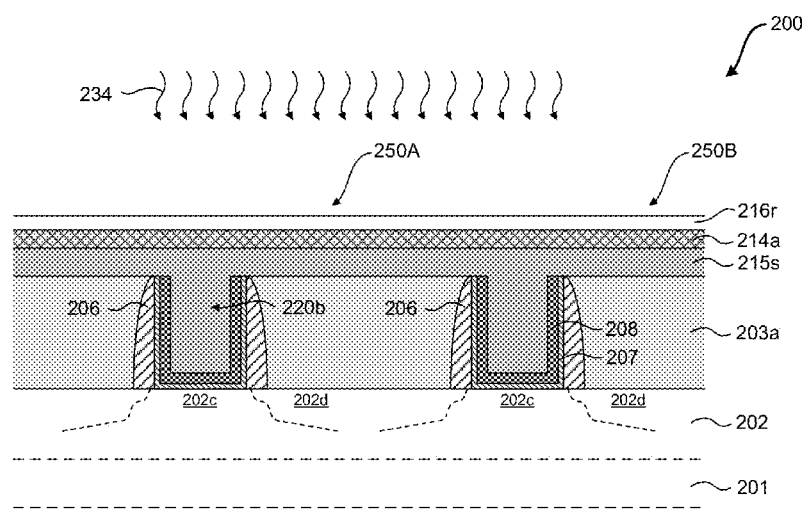
Figure 2K:
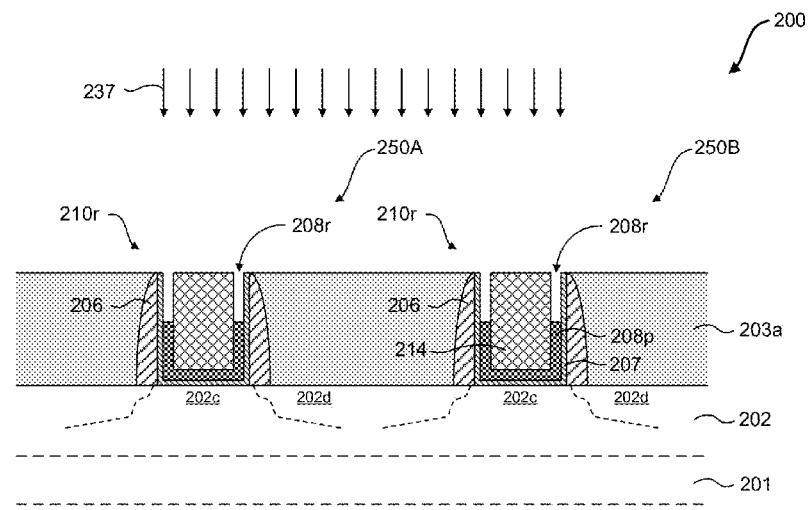
FIGS. 2k-2n schematically illustrate another technique for forming a replacement metal gate electrodes in accordance with yet another embodiment of the present disclosure.
Figure 2L:
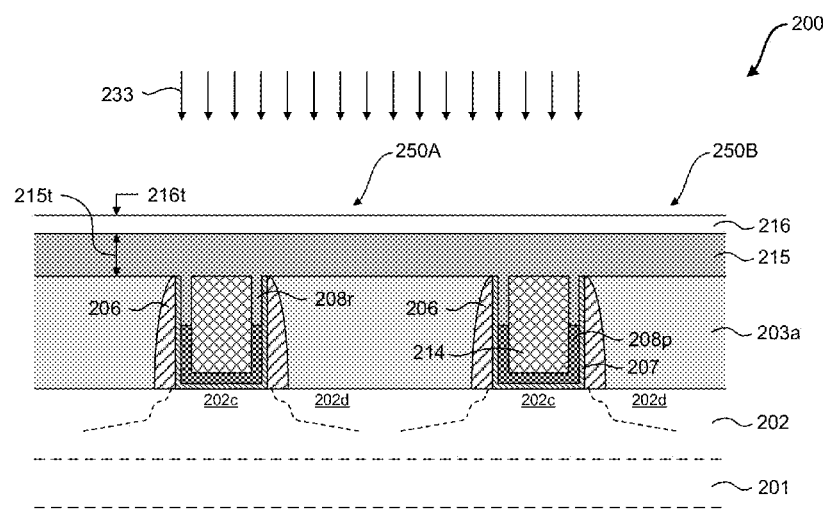
Figure 2M:
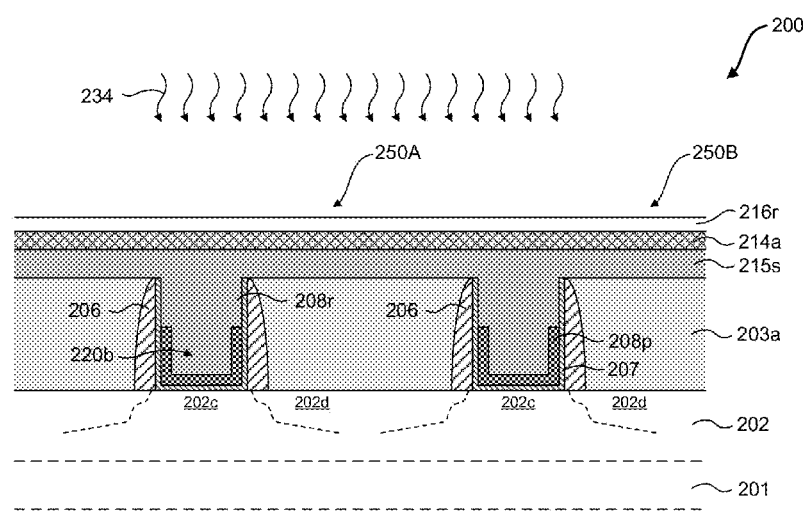
Figure 2N:
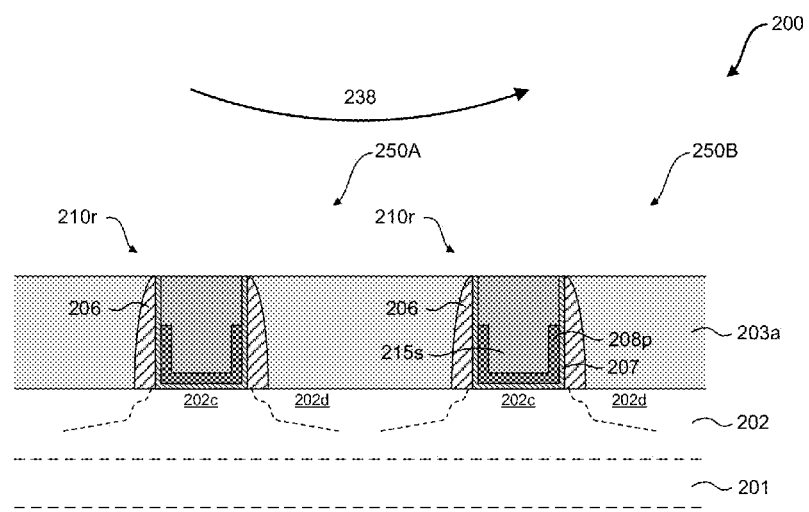
Figure 2O:
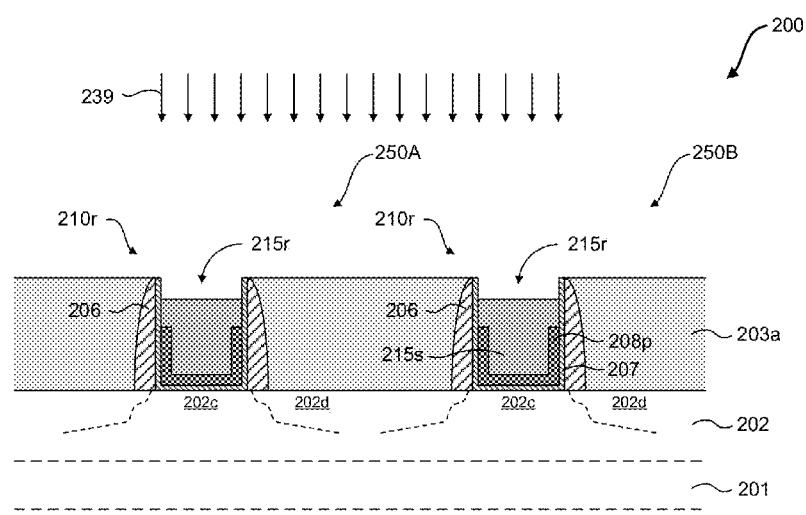
FIGS. 2o-2r schematically depict yet an illustrative technique for forming contact elements to transistor elements made up of metal gate structures in accordance with one embodiment of the present disclosure.
Figure 2P:
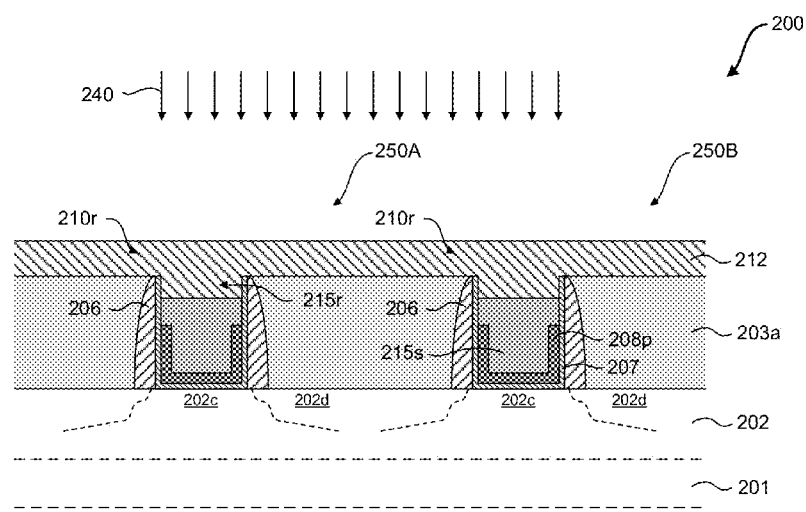
Figure 2Q:
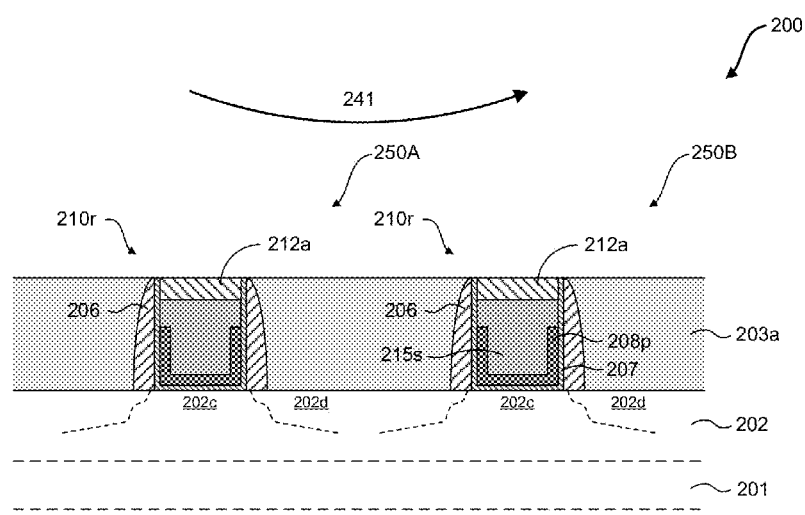
Figure 2R:
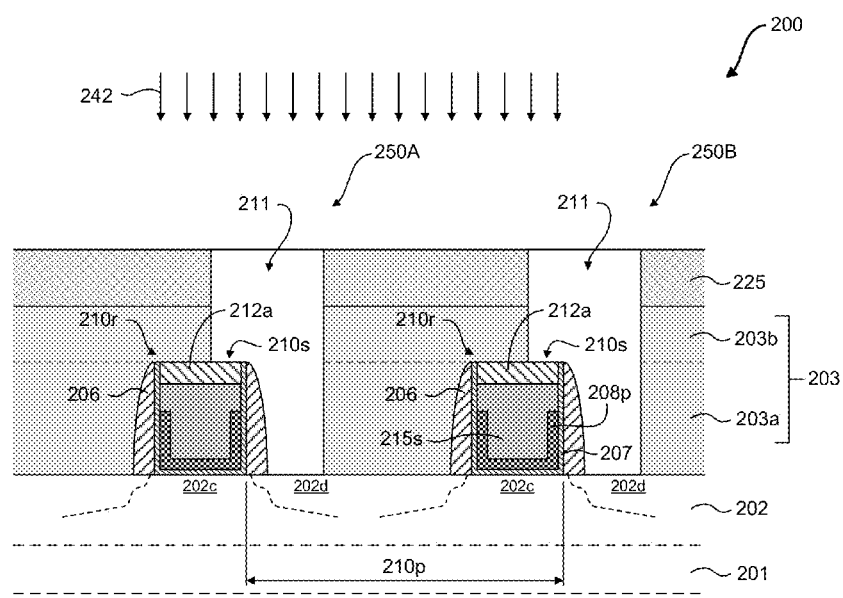

It should be noted that, where appropriate, the reference numbers used in describing the various elements shown in the illustrative embodiments of FIGS. 2a-2r and/or FIGS. 3a-3j may substantially correspond, where appropriate, to the reference numbers used in describing related elements illustrated in FIGS. 1a-1h above, except that the leading numeral in each figure has been changed from a "1" to a "2" or a "3," as appropriate. For example, the semiconductor device "100" corresponds to the semiconductor devices "200" and "300," the substrate "101" corresponds to the substrates "201" and "301," the gate structures "110" corresponds to the gate structures "210" and "310," and so on. Accordingly, the reference number designations used to identify some elements of the presently disclosed subject matter may be illustrated in the FIGS. 2a-2r and FIGS. 3a-3j but may not be specifically described in the following disclosure. In those instances, it should be understood that the numbered elements shown in FIGS. 2a-2r and FIGS. 3a-3j which are not described in detail below substantially correspond with their like-numbered counterparts illustrated in FIGS. 1a-1h and described in the associated disclosure set forth above.

Furthermore, it should also be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device 100 depicted in FIG. 1a, it should be understood that the gate structures 110 are formed "above" the semiconductor layer 102 and the channel region 102c, and that the substrate 101 is positioned "below" or "under" the semiconductor layer 102. Similarly, it should also be noted that sidewall spacers 106 are positioned "adjacent to" the sidewalls of the dummy gate electrodes 105, whereas in special cases, the spacers 106 may be positioned "on" the sidewalls of the dummy gate electrodes 105 in those configurations where no other layers or structures are interposed therebetween.

FIG. 2a shows a schematic cross-sectional view of an illustrative semiconductor device 200 of the present disclosure during an intermediate manufacturing stage that is substantially similar to that of the semiconductor device 100 as shown in FIG. 1a and described above. The semiconductor device 200 of FIG. 2a may include, among other things, a substrate 201, in and above which illustrative transistor elements 250A, 250B may be formed based on well-established semiconductor device processing techniques. The substrate 201 may represent any appropriate substrate on which may be formed a semiconductor layer 202, such as a silicon-based layer, or any other appropriate semiconductor material that may facilitate the formation of the first and second transistor elements 250A, 250B.

It should be appreciated that the semiconductor layer 202, even if provided as a silicon-based layer, may include other materials, such as germanium, carbon, and the like, in addition to an appropriate dopant species for establishing the requisite conductivity types in each of a first and second active regions (not shown) of the semiconductor layer 202. It should be noted that, in some illustrative embodiments, the transistor elements 250A, 250B each may be formed as one of a plurality of bulk transistors, i.e., the semiconductor layer 202 may be formed on or be part of a substantially crystalline substrate material, while in other cases, certain device regions of the device 200—or the entire device 200—may be formed on the basis of a silicon-on-insulator (SOI) architecture, in which case a buried insulating layer (not shown) may be provided below the semiconductor layer 202.

In the manufacturing stage of the illustrative semiconductor device 200 shown in FIG. 2a, the transistor elements 250A, 250B may be made up of gate structures 210, each of which may include a dummy gate dielectric layer 204 formed above a channel region 202c of the device 200, a dummy gate electrode 205, and sidewall spacer structures 206, which may include one or more individual spacer elements (not shown), such as liner layers, offset spacers, and the like, which, depending on the specific processing scheme, may be used as mask layers to form source/drain regions 202d based on dopant implantation techniques that are known to those skilled in the art. Additionally, and depending on the overall device design requirements, optional raised source/drain regions 202r may also be formed in and/or above the semiconductor layer 202, as shown in FIG. 2a. Furthermore, metal silicide contact regions (not shown) may be formed in an upper surface portion of the source drain regions 202d (or in the raised source/drain regions 202r, when present) so as to facilitate the creation of an electrical contact between a first metallization layer (not shown) of the semiconductor device 200 and the transistor elements 250A, 250B. (See, e.g., FIG. 3j, as described below).

In certain illustrative embodiments of the present disclosure, the semiconductor device 200 may include a first layer portion 203a of an interlayer dielectric material 303 (see, FIG. 2r, described below). The first layer portion 203a may be made up of, for example, silicon dioxide and the like, and may be formed above the source/drain regions 202d of the semiconductor layer 202 (and/or the raised source/drain regions 202r, when present) so as to surround the gate structures 210 and electrically isolate the transistor elements 250A, 250B. As shown in the manufacturing stage illustrated in FIG. 2a, the first layer portion 203a may be planarized by using well-known techniques, such as CMP and the like, so as to expose an upper surface 205s of the dummy gate electrode 205.

FIG. 2b shows the illustrative semiconductor device 200 of FIG. 2a during a subsequent processing step, wherein the device 200 is exposed to a suitably designed multi-step etch process 230 so as to selectively remove the dummy gate electrodes 205 and the dummy gate dielectric layers 204 from above the channel regions 202c of the respective transistor elements 250A and 250B. In certain illustrative embodiments, the removal of the dummy gate electrode 205 and the dummy gate dielectric layer 204 may thereby form a gate cavity 220a in each of the gate structures 210, i.e., inside of and between the sidewall spacer structures 206 and above the channel regions 202c.

FIG. 2c illustrates the semiconductor device shown in FIG. 2b after some further processing steps have been completed so as to form a layer of high-k dielectric material 207 and a layer of work-function material 208 above both transistor elements 250A, 250B. In certain illustrative embodiments, a suitably designed deposition sequence 231 may be performed so as to first deposit the high-k dielectric material 207 above the first layer portion 203a, inside of and along the sidewall structures 206, and above the channel region 202c. Thereafter, the work-function material 208 may be formed on and/or above the high-k dielectric material 207, as shown in FIG. 2c. Furthermore, after forming the work-function material 208, reduced-sized gate cavities 220b may be present in the gate structures 210, the reduced-sized gate cavities 220b having a gap width 220w and a depth 220d.

As previously described, the layer of high-k dielectric material 207 may be made up of one or more layers of a plurality of different high-k materials (i.e., materials having a dielectric constant of approximately 10 or greater), such as may include tantalum oxide, hafnium oxide, and/or zirconium oxide, and the like. Furthermore, depending on the device type (e.g., NMOS and/or PMOS transistors), the layer of work-function material 208 may also include one or more layers of a plurality of different metal materials that, in combination, may be adapted to control the work function of the HK/MG transistor elements 250A, 250B, such as, for example, titanium nitride, titanium-aluminum, tantalum nitride, and the like. It should be appreciated, however, that the specific material used for the layer of work-function material 208 need not be the same for both transistor elements 250A, 250B.

FIG. 2d schematically illustrates the semiconductor device 200 shown in FIG. 2c in a further advanced processing stage, after a semiconductor material layer 214 has been formed above the device 200 so as to fill the reduced-sized gate cavities 220b. In certain illustrative embodiments, the semiconductor material layer 214 may be a silicon material, such as amorphous silicon or polysilicon, and furthermore may be formed by performing a suitably design deposition process 232, such as, for example, a chemical vapor deposition (CVD) process, and the like. In some illustrative embodiments, the aspect ratio of the reduced-sized gate cavities 220b (i.e., the ratio of the depth 220d to the gap width 220w—see, FIG. 2c) may be substantially the same as, or even greater than, that of the reduced-sized gate cavities 120 as shown in the prior art FIG. 1b and described above. However, it should be appreciated that, when compared to the chemical vapor deposition of aluminum (as is commonly used in the prior art process described above), a CVD process may have greater gap-fill capabilities when forming semiconductor materials such as the amorphous silicon or polysilicon that may be used in at least some illustrative embodiments of the present disclosure. Accordingly, the semiconductor material layer 214 may be formed substantially without any voids, such as the voids 109v shown in FIG. 1c and described above.

Also as shown in FIG. 2d, the semiconductor material layer 214 may be formed with an excess thickness 214t above the first layer portion 203a. The excess thickness 214t may be adjusted as necessary to increase the likelihood that the reduced-sized gate cavities 220b may be substantially completely filled during the deposition process 232. In certain embodiments, the excess thickness 214t may be as great as 100 nm, although, as described below, the amount of excess thickness 214t may also have an impact on subsequent device processing steps, such as the material substitution processes described in further detail below. For example, in one illustrative embodiment, the thickness 214t may range from about 60-90 nm.

After the semiconductor material layer 214 has been formed, a further deposition sequence 233 may be performed so as to form additional material layers above the semiconductor material layer 214 in advance of performing a material substitution process that is adapted to substitute an appropriate metal gate electrode material for the material of the semiconductor material layer 214. As shown in FIG. 2e, in some illustrative embodiments the deposition sequence 233 may be adjusted so as to perform a first deposition step, such as by a CVD process and the like, that is designed to form a layer of replacement metal gate electrode material 215, such as, for example, aluminum, above the semiconductor material layer 214. Furthermore, in at least some embodiments, the volume of material in the layer of replacement metal gate electrode material 215 may be at least greater than the amount of material in the semiconductor material layer 214—including the excess thickness 214t and the amount filling the reduced-sized gate cavities 220b—in order for the layer of replacement metal gate electrode material 215 to fully replace the semiconductor material layer 214, as previously described.

For example, in certain illustrative embodiments, the thickness 215t of the layer of replacement metal gate electrode material 215 may be approximately twice that of the excess thickness 214t of the semiconductor material layer 214 so as to increase the likelihood that a substantially complete material substitution takes place during subsequent processing steps. Accordingly, the thickness 215t may be on the order of approximately 200 nm in those embodiments of the present disclosure wherein the excess thickness 214t is approximately 100 nm, although other thicknesses may also be used, depending on the specific sizes (i.e., length and width) of the replacement gate electrodes.

Next, in at least some embodiments, the deposition sequence 233 may then be adjusted so as to perform a second deposition step, such as by a CVD process and the like, that is designed to form a trapping material layer 216 above the layer of replacement metal gate electrode material 215. In certain illustrative embodiments of the present disclosure, the trapping material layer 216 be made up of, for example, a silicide-forming metal material such as titanium and the like. As with the layer of replacement metal gate electrode material 215, in at least some embodiments, the volume of material in the trapping material layer 216 may be adjusted so as to increase the likelihood that there is sufficient material available in the trapping material layer 216 to attract and alloy with the full volume of material present in the semiconductor material layer 214, such as by forming a metal silicide, e.g., titanium silicide. In this way, it increases the likelihood that the material of the semiconductor material layer 214 can be fully replaced by the layer of replacement metal gate electrode material 215. For example, in those embodiments wherein the material making up the trapping material layer 216 may eventually form an alloy such as a metal silicide with the semiconductor material layer 214, the thickness 216$t$ of the trapping material layer 216 may be on the order of about one-half of the excess thickness 214$t$ of the semiconductor material layer 214. Accordingly, the thickness 216$t$ may be approximately 50 nm when the excess thickness 214$t$ is on the order of 100 nm, although other thicknesses may also be used.

FIG. 2$f$ shows the illustrative semiconductor device of FIG. 2$e$ in a further manufacturing stage, wherein the device 200 is exposed to a thermal treatment process 234 that is adapted facilitate the material substitution process previously described. As shown in FIG. 2$f$, the layer of replacement metal gate electrode material 215 (see, FIG. 2$e$) has been substituted for the semiconductor material layer 214 (see, FIG. 2$e$), thereby forming a layer of substitute metal gate electrode material 215$s$ above the semiconductor device 200 that. In some embodiments, the substitute metal gate electrode material 215$s$ is substituted for at least a portion of the semiconductor material layer 214, whereas in other illustrative embodiments, the substitute metal gate electrode material 215$s$ may substantially completely fill the reduced-sized gate cavities 220$b$, and substantially completely replace the semiconductor material layer 214, as is illustrated in FIG. 2$f$. Additionally, in certain embodiments, an alloy material region 214$a$, made up of the materials comprising the semiconductor material layer 214 and the trapping material layer 216, may now be present above the layer of substitute metal gate electrode material 215$s$. Furthermore, in at least some illustrative embodiments, a residual trapping material layer 216$r$ may also be present above the alloy material region 214$a$, in those embodiments wherein a greater volume of material was present in the trapping layer 216 (see, FIG. 2$e$) than was needed to fully alloy with the semiconductor material layer 214 (see, FIG. 2$e$).

As noted previously, the amount of time that it may be necessary to perform the thermal treatment process 234 so as to increase the likelihood that a substantially complete material substitution occurs may sometimes depend on the initial volume of the semiconductor material layer 214 (see, FIG. 2$e$). For example, in the illustrative embodiment of the present disclosure shown in FIGS. 2$d$-2$f$, wherein an excess thickness 214$t$ of the semiconductor material layer 214 may be present above the first layer portion 203$a$, the thermal treatment process 234 may be performed in the range of 20-30 minutes. However, it should be appreciated that this time may be adjusted as may be dictated by the specific treatment temperature, which, as previously noted, may, in some embodiments, range between 375-450° C.

FIG. 2$g$ schematically illustrates the semiconductor device 200 after completion of the thermal treatment process 234—i.e., after the layer of substitute metal gate electrode material 215$s$ has been formed in all, or at least part of, the reduced-sized gate cavities 220$b$—wherein a planarization process 235, such as a CMP process and the like, may be performed. As shown in FIG. 2$g$, the planarization process 235 may be performed so as to remove the residual trapping material layer 216$r$ alloy material region 214$a$ from above the layer of substitute metal gate electrode material 215$s$. Furthermore, in some illustrative embodiments, the planarization process 235 may be adjusted so as to further remove excess portions of the layer of substitute metal gate electrode material 215$s$, the layer of work-function material 208, and the layer of high-k dielectric material 207 from above the first layer portion 203$a$ so as to form replacement gate structures 210$r$. In certain illustrative embodiments, the layer of high-k dielectric material 207 may be used as a CMP stop indicator layer, wherein even a portion of the layer of high-k dielectric material 207 may remain above the first layer portion 203$a$. Thereafter, further processing of the transistor elements 250A, 250B may be continued by forming contact elements (not shown) from a first metallization layer (not shown) to one or more of the source/drain regions 202$d$, as will be further described with respect FIG. 2$r$ below.

Another illustrative embodiment of the device processing techniques used for forming the semiconductor device 200 shown in FIGS. 2$a$-2$g$ is schematically illustrated in FIGS. 2$h$-2$j$, which will be described in further detail below.

FIG. 2$h$ schematically illustrates the semiconductor device 200 shown in FIG. 2$d$ in a further advanced processing stage based on another embodiment of the presently disclosed subject matter. As illustrated in FIG. 2$h$, the semiconductor device 200 may be subjected to a planarization process 236, such as a CMP process and the like, that is adapted to remove the excess thickness 214$t$ of the semiconductor material layer 214 (see, FIG. 2$d$), the layer of work-function material 208, and the layer of high-k dielectric material 207 that have been formed outside of the gate cavities 220$a$ (see, FIG. 2$b$) from above the first layer portion 203$a$. In some illustrative embodiments, the layer of high-k dielectric material 207 may be used as a CMP stop indicator layer, and in certain embodiments, a portion of the layer of high-k dielectric material 207 may remain above the first layer portion 203$a$.

Thereafter, as shown in FIG. 2$i$, a deposition sequence 233 may performed so as to form a layer of replacement metal gate electrode material 215 and a trapping material layer 216 above the semiconductor material layer 214, as previously described with respect to FIG. 2$e$ above. It should be appreciated that, since the semiconductor material layer 214 has been planarized (see, FIG. 2$h$), and is therefore only present in the reduced-sized gate cavities 220$b$, a substantially smaller volume of the semiconductor material layer 214 may need to be replaced during a subsequently performed material substitution process. Accordingly, commensurately smaller volumes of the replacement metal gate electrode material 215 and the trapping material 216 may be required to increase the likelihood that a substantially complete material substitution occurs, as compared to the illustrative embodiment of FIG. 2$e$ described above. For example, in some illustrative embodiments, the thickness 215$t$ of the layer of replacement metal gate electrode material 215 may be on the order of approximately 75-125 nm, whereas the thickness 216$t$ of the trapping material layer may be on the order of 30-40 nm.

FIG. 2$j$ schematically illustrates the semiconductor device 200 of FIG. 2$i$ during a subsequent processing step, when the device 200 is exposed to a thermal treatment process 234 that is adapted facilitate the material substitution process previously described. As shown in FIG. 2$j$, the layer of replacement metal gate electrode material 215 (see, FIG. 2$i$) has been substituted for the semiconductor material layer 214 present in the reduced-sized gate cavities 220$b$ (see, FIG. 2$i$), thereby forming a layer of substitute metal gate electrode material 215$s$ in the gate cavities 220$b$ and above the first layer portion 203$a$. Furthermore, as with the previously described embodiment illustrated in FIG. 2$f$, an alloy material region 214$a$ and a residual trapping material layer 216$r$ may now be present above the layer of substitute metal gate electrode material 215$s$. Moreover, as may be appreciated by one of ordinary skill having the benefits of the present disclosure, the amount of time required for the thermal treatment process 234 so as to increase the likelihood that a substantially complete material substitution occurs may also be significantly reduced. Accordingly, in certain embodiments, the total time that the thermal treatment process 234 is performed may be in the range of 15-20 minutes, or even less.

After completion of the thermal treatment process 234, wherein the layer of substitute metal gate electrode material 215s has been formed in and above the reduced-sized gate cavities 220b, the semiconductor device 200 shown in FIG. 2j may be subject to a planarization process, e.g., a CMP process, so as to form replacement metal gate structures 210r as described above and illustrated in FIG. 2g. Thereafter, further device processing may be performed as previously described.

Yet another illustrative embodiment of the device processing techniques used for forming replacement metal gate electrodes based on a material substitution technique is schematically illustrated in FIGS. 2k-2n and described in further detail below.

FIG. 2k schematically illustrates a semiconductor device 200 that is substantially similar to the device 200 shown in FIG. 2h in a further advanced processing stage based on yet another illustrative embodiment of the present disclosure. In certain embodiments, after completion of the planarization process 236 shown in FIG. 2h, the semiconductor device 200 of FIG. 2k may be subjected to an etch process 237 that is adapted to selectively remove an upper portion of the work-function material 208, thereby forming recesses 208r and leaving a lower portion 208p of the work-function material 208 in the gate structures 210. Thereafter, as shown in FIG. 2l, a deposition sequence 233 may be performed as previously described so as to first form a layer of replacement metal gate electrode material 215 above the first layer portion 203a, and to then form a trapping material layer 216 above the layer of replacement metal gate electrode material 215. Furthermore, in at least some illustrative embodiments, the deposition parameters of the deposition sequence 233 may be adjusted as may be necessary to substantially completely fill the recesses 208r. As with the earlier described embodiments illustrated in FIGS. 2e and 2i, the volume of material in both the layer of replacement metal gate electrode material 215 and the trapping material layer 216, and the corresponding thicknesses 215t and 216t, respectively, may be adjusted in certain embodiments so as to increase the likelihood that a substantially complete material substitution takes place during subsequent processing steps.

FIG. 2m depicts the semiconductor device 200 during a subsequent heat treatment process 234, which may be performed as previously described so as to substitute the layer of replacement metal gate electrode material 215 (see, FIG. 2l) for the semiconductor material layer 214 that was previously formed in the reduced-sized gate cavities 220b (see, e.g., FIG. 2h). During the heat treatment process 234, which, in some embodiments, may be performed at a temperature in the range of approximately 375-450° C. and for a time of about 15-20 minutes, a layer of substitute metal gate electrode material 215s may be formed above the semiconductor device 200 so as to substantially completely fill the reduced-size gate cavities 220b and the previously-formed recesses 208r. Additionally, an alloy material region 214a may be formed above the layer of substitute metal gate electrode material 215s, and a residual trapping material layer 216r may be present above the alloy material region 214a, as previously described. Thereafter, as shown in FIG. 2n, a planarization process 238, for example a CMP process, may be performed in certain embodiments so as to remove any residual trapping material layer 216r and the alloy material region 214a from above the layer of substitute metal gate electrode material 215s, as well as the excess layer portion of the substitute metal gate electrode material 215s from above the first layer portion 203a, thereby forming the replacement metal gate structures 210r.

In at least some illustrative embodiments, it may be desirable to eventually form conductive contact elements (not shown) from a first metallization layer (not shown) of the semiconductor device 200 to at least one of the source and drain regions 202d of the transistor elements 250A, 250B. However, as previously noted, due to the ever-decreasing gate electrode pitch dimensions 210p (see, FIG. 2r) associated with aggressively scaled semiconductor devices, borderless or self-aligned contact elements may be used, and due to the present limitations on state-of-the art photolithography processes, some degree of misalignment may occur between the photoresist mask that is used to form contact via openings and the underlying gate electrode pattern. In such cases, the contact via opening may partially expose an upper surface of the replacement metal gate structures 210r. As previously described, this can potentially lead to the contact elements creating electrical shorts between a metal gate structures 210r and the corresponding source/drain regions 202d. FIGS. 2o-2r schematically illustrate one method for forming contact via openings that may address such a problem.

As shown in FIG. 2o, a suitably designed etch process 239 may be performed so as to selectively remove an upper portion of the substitute metal gate electrode material 215s from the replacement metal gate structure 210r, thereby forming recesses 215r. In at least some illustrative embodiments of the present disclosure, a dielectric cap layer 212 may then be formed above the first layer portion 203a and the replacement metal gate structures 210r so as to fill the recesses 215r, as illustrated in FIG. 2p. In certain embodiments, the dielectric cap layer 212 may be formed by performing a deposition process 240, such as a CVD process and the like. Furthermore, the dielectric cap layer 212 may be made up of a material that is substantially the same as that of the sidewall spacer structures 206, e.g., silicon nitride, so that the material making up the interlayer dielectric material 203 (see, FIG. 2r) may be selectively etchable with respect to both the later-formed dielectric cap elements 212a (see, FIG. 2r) and the sidewall spacer structures 206 during subsequent processing steps, wherein contact via openings 211 (see, FIG. 2r) may be formed in the interlayer dielectric material 203.

Next, as shown in FIG. 2q, in certain illustrative embodiments a planarization process 241, e.g., a CMP process, may be performed so as to remove the excess portions of the dielectric cap layer 212 from above the first layer portion 203a, and thereby forming dielectric cap elements 212a above the replacement metal gate structures 210r. FIG. 2r schematically illustrates the semiconductor device 200 after further processing steps have been performed so as to form a second layer portion 203b of the interlayer dielectric material 203 above the first layer portion 203a, and to thereafter form a patterned mask layer 225 above the second layer portion 203b. In some illustrative embodiments, the second layer portion 203b may be made up of substantially the same material as that of the first layer portion 203a, such as, for example, silicon dioxide and the like. Accordingly, the requisite etch selectivity with respect to the dielectric cap elements 212a and the sidewall spacer structures 206 may be realized during a selective etch process 242 that is adapted to form the contact via openings 211 so as to expose the source/drain regions 202d. As previously discussed, even in those instances wherein the photoresist pattern of the mask layer 225 may be misaligned with the gate electrode pattern of the semiconductor device 200 such that the contact via openings 211 expose at least a portion of the upper surfaces 210s of the replacement gate structures 210r, the dielectric cap elements 212a may serve to substantially insulate the replacement gate structures 210r from any conductive contact elements (not shown) that may later be formed in the contact via openings 211, thereby creating self-aligned contact elements that substantially avoiding the likelihood of a short between the electrodes 210r and the source/drain regions 202d.

Figure 3A:
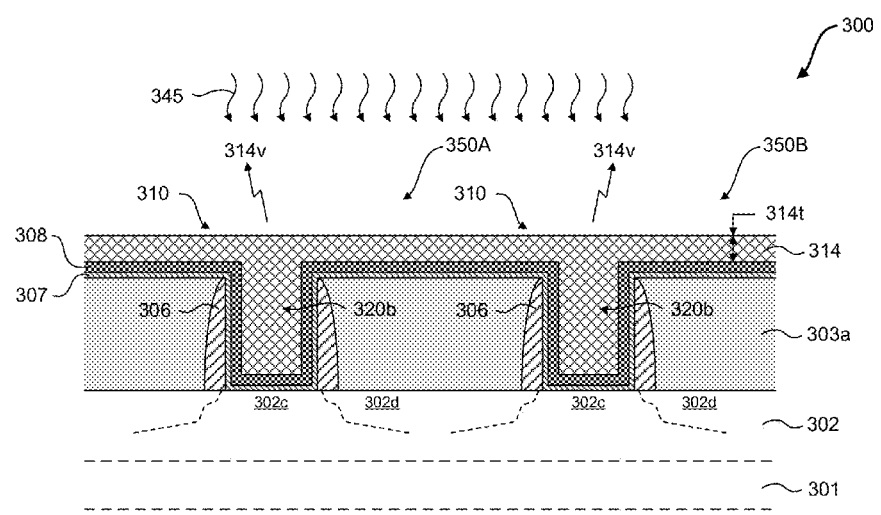
FIGS. 3a-3c schematically depict an illustrative technique for forming replacement metal gate electrodes in accordance with another embodiment of the present disclosure.
Figure 3B:
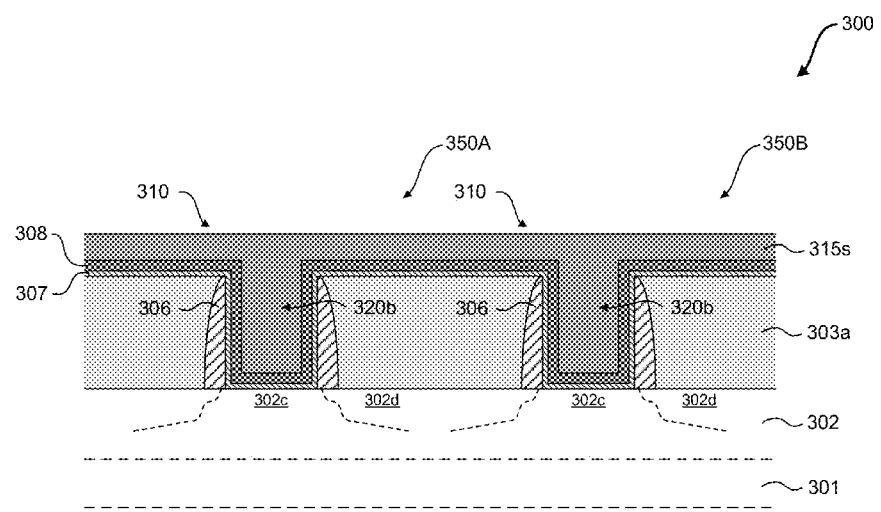
Figure 3C:
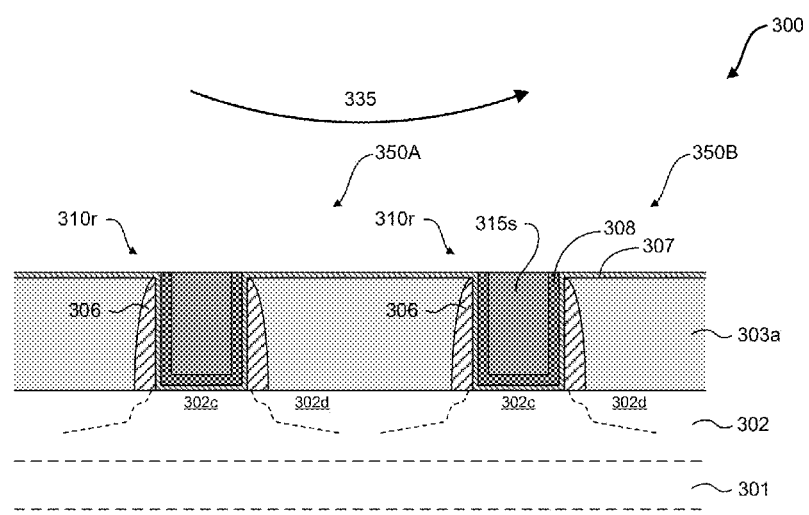

FIGS. 3a-3c schematically depict an illustrative embodiment of forming replacement metal gate structures utilizing a different material substitution process, as will be further discussed in detail below.

FIG. 3a schematically illustrates a semiconductor device 300 during an intermediate stage of manufacturing that is substantially similar to FIG. 2d described above, wherein like numbers (except for the leading digit "3" vs. "2") represent like elements. As shown in the manufacturing stage depicted in FIG. 3a, the semiconductor device 300 includes a layer of high-k dielectric material 307 and a layer of work-function material 308 formed above a first layer portion 303a of an interlayer dielectric material 303 (see, FIG. 3j, described below). Furthermore, a layer of semiconductor material 314 may be formed above the layer of work-function material 308 so as to substantially fill the reduced-sized opening 320b. The manufacturing techniques used to form the semiconductor device 300 of FIG. 3a may be substantially as previously discussed, and will not be described herein in any detail.

The semiconductor device 300 may then be exposed to a gaseous treatment ambient 345 that is designed to form a layer of substitute metal gate electrode material 315s (see, FIG. 3b) in place of the semiconductor material layer 314, which, in certain embodiments may be made up of a silicon material, such as amorphous silicon or polysilicon. Furthermore, the gaseous treatment ambient 345, which may include, for example, gaseous $WF_6$, may be maintained at a temperature that is in the range of 350-450° C. For example, as previously described, during the material substitution process, when gaseous $WF_6$ is present in the gaseous treatment ambient 345, the $WF_6$ may decompose to form a substitute metal gate electrode material 315s (see, FIG. 3b) that is substantially made up of tungsten, thus releasing a volatile gaseous compound 314v that is made up of, among other things, the material comprising the semiconductor material layer 314. In those illustrative embodiments wherein the semiconductor material layer 314 is made up of a silicon material, the volatile gaseous compound 314v may be, for example, $SiF_4$.

Generally, the length of time that the semiconductor device 300 may be exposed to the gaseous treatment ambient 345 may vary depending on the volume of material in the semiconductor material layer 314—i.e., depending on the size of the reduced-sized openings 320b and the excess thickness 314t. In at least some embodiments, the exposure time may be approximately 30 minutes, whereas in other embodiments, the exposure time may be either or more or less, depending on the amount of semiconductor material, e.g., silicon, that is available for substitution. It should be appreciated, however, that since the decomposition reaction that forms the basis of the material substitution process that is used replace the material of the semiconductor material layer 314 (e.g., silicon) with the material of the layer of substitute gate electrode material 315s (e.g., tungsten) is temperature dependent, both the exposure time and exposure temperature may vary accordingly.

FIG. 3b illustrates the semiconductor device 300 of FIG. 3a after completion of the gaseous treatment ambient 345, and after the layer of substitute metal gate electrode material 315s has substantially completely replaced the semiconductor material layer 314. Thereafter, as shown in FIG. 3c, a planarization process 335 may be performed so as to remove excess portions of the layer of substitute metal gate electrode material 315s, the layer of work-function material 308, and the layer of high-k dielectric material 307 from above the first layer portion 303a, thereby forming replacement metal gate structures 310r. In certain illustrative embodiments, the layer of high-k dielectric material 307 may be used as a CMP stop indicator layer, wherein a portion of the layer of high-k dielectric material 307 may remain above the first layer portion 303a, as is shown in FIG. 3c. Thereafter, further processing of the transistor elements 350A, 350B may be continued by forming contact elements (not shown) from a first metallization layer (not shown) to one or more of the source/drain regions 302d, as will be further described with respect FIG. 3j below.

Figure 3D:
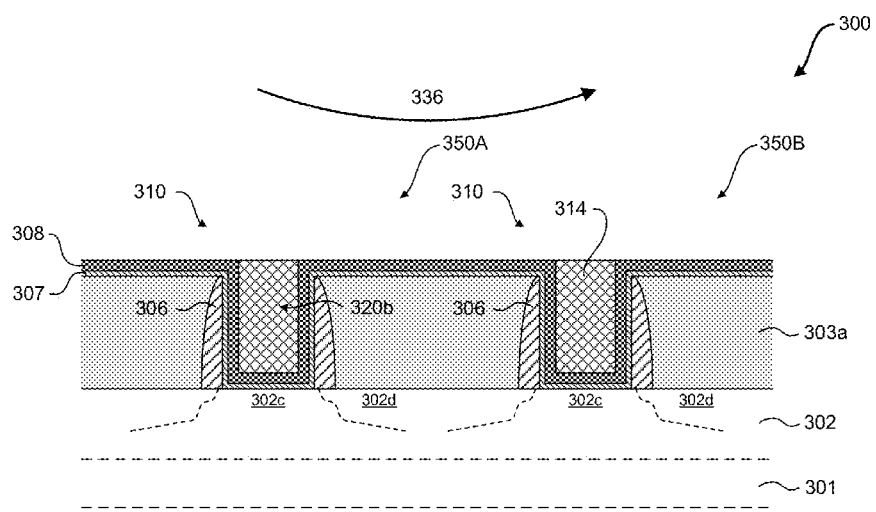
FIGS. 3d-3e schematically depict a technique for forming replacement metal gate electrodes in accordance with a further illustrative embodiment of the present disclosure.
Figure 3E:
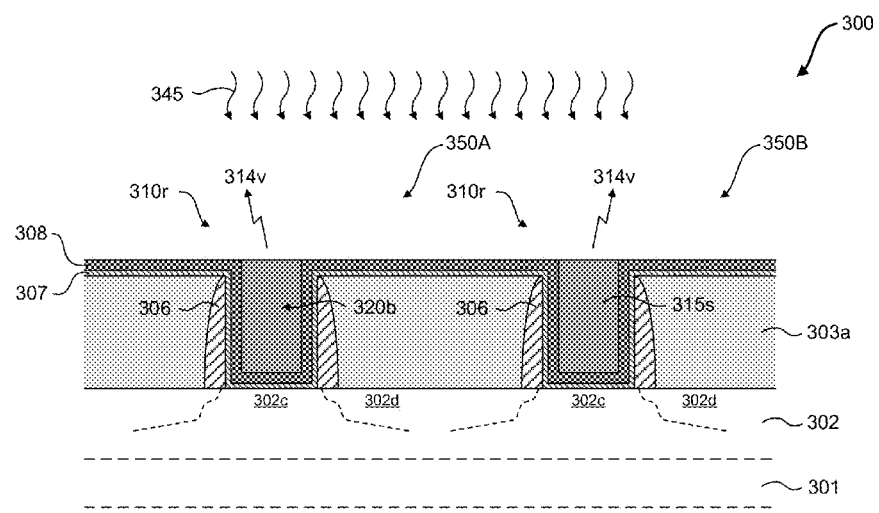

FIGS. 3d-3e schematically illustrate a further illustrative embodiment of the present disclosure, wherein the semiconductor material layer 314 is subjected to a planarization process prior to performing a material substitution process that is based on a gaseous treatment ambient, such as the gaseous treatment ambient 345 shown in FIG. 3a and described above. As shown in FIG. 3d, in certain embodiments, a planarization process 336, such as, for example, a CMP process and the like, may be performed on the semiconductor device 300 to remove any excess portions of the semiconductor material layer 314, such as the excess thickness 314t shown in FIG. 3a, from above the layer of work-function material 308, so as to reduce the volume of material that will be subjected to the material substitution process. Thereafter, as shown in FIG. 3e, the semiconductor device 300 may be exposed to a gaseous treatment ambient 345 that is made up of, among other things, $WF_6$ and the like, so as to replace the semiconductor material layer 314 that is present in the reduced-sized openings 320b (see, FIG. 3d) with a substitute metal gate electrode material 315s, such as tungsten, and release a volatile gaseous compound 314v, such as $SiF_4$. After completion of the above-described material substitution process, further processing of the semiconductor device 300 may continue as described with respect to FIG. 3j below.

As may be appreciated by those of ordinary skill having the benefit of the present disclosure, the time and/or temperature at which the semiconductor device 300 is exposed to the gaseous treatment ambient 345 may be substantially reduced as compared to the embodiment illustrated in FIGS. 3a-3b, due to the significant reduction in volume of material of the semiconductor material layer 314 that must be replaced. Accordingly, the material substitution process of the present embodiment may have a reduced impact on the overall thermal budget of the semiconductor device 300 shown in FIGS. 3d-3e. For example, in the illustrative embodiment depicted in FIG. 3e, due to the reduced volume of the semiconductor material layer 314, the exposure time for the gaseous treatment ambient 345 may be commensurately reduced to approximately 15-30 minutes. Other exposure times may also be used.

Figure 3F:
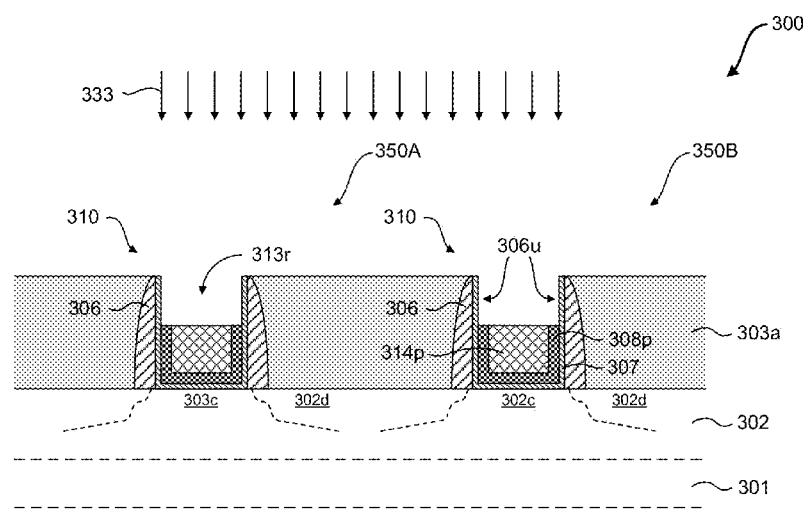
FIGS. 3f-3g schematically illustrate yet another technique for forming replacement metal gate electrodes in accordance with additional illustrative embodiments of the present disclosure.
Figure 3G:
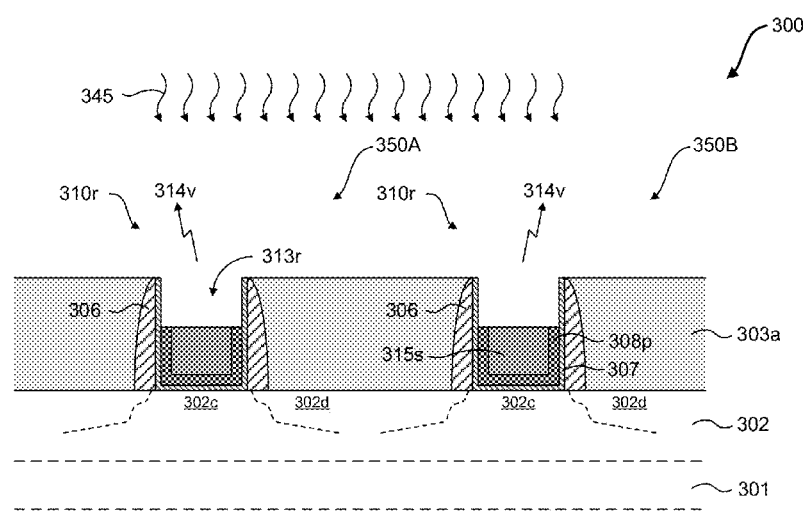

FIGS. 3f-3g schematically depict a further illustrative embodiment of the present disclosure, wherein the planarized semiconductor device 300 shown in FIG. 3d may be exposed to an etch sequence 333 that is adapted to form a recess 313r the gate structures 310 prior to performing the previously described material substitution process. In at least some embodiments, the etch sequence 333 may include a first etch step that is adapted to remove the horizontal portions of the layer of work-function material 308 from above the first layer portion 303a, as well as an upper vertical portion of the layer of work-function material 308 adjacent to an inside upper portion 306u of the sidewall spacer structures 306, thus leaving a lower portion 308p of the work-function material 308 in the gate structures 310. Additionally, the etch sequence 333 may include a second etch step that is adapted to remove an upper portion only of the semiconductor material layer 314, also leaving a lower portion 314p in the gate structures 310. Furthermore, in certain illustrative embodiments, and depending on the specific etch recipes employed, the horizontal portions of the layer of high-k dielectric material 307 formed above the first layer portion 303a may also be removed during the etch sequence 333, as shown in FIG. 3f. Thereafter, as shown in FIG. 3g, the semiconductor device 300 of FIG. 3f may be exposed to a gaseous treatment ambient 345 as previously described so as to replace the lower portions 314p of the semiconductor material layer 314 with a layer of substitute gate electrode material 315s, thus forming replacement metal gate structures 310r.

Figure 3H:
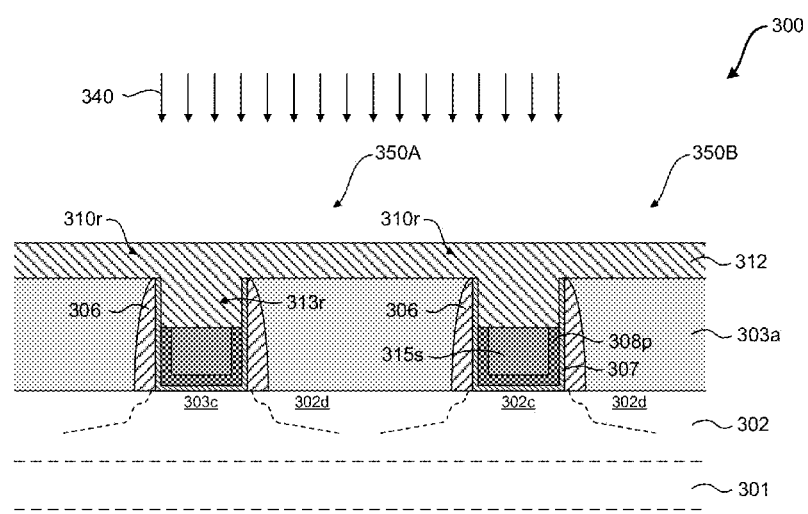
FIGS. 3h-3j schematically depict a technique for forming contact elements to transistor elements made up of metal gate structures in accordance with another illustrative embodiment disclosed herein.
Figure 3I:
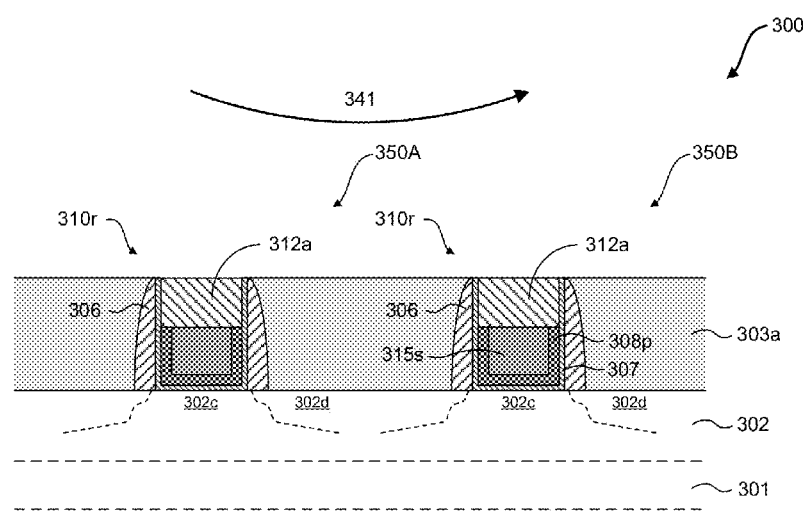
Figure 3J:
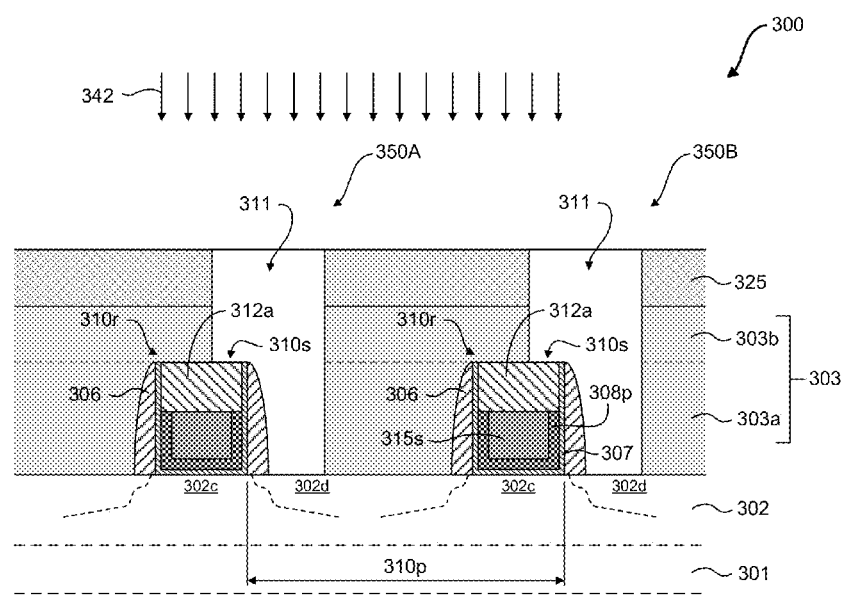

FIGS. 3h-3j schematically illustrate another method that may be used to substantially avoid the short problems that are sometimes associated with forming conductive contact elements from a first metallization layer of a semiconductor device to one of the source drain regions of illustrative transistor elements that are made up of replacement metal gate structures. FIG. 3h shows the semiconductor device 300 of FIG. 3g in a further advanced manufacturing stage, wherein a dielectric cap layer 312 may be formed above the first layer portion 303a and the replacement metal gate structures 310r. Furthermore, as shown in FIG. 2h, the dielectric cap layer 312 may be formed so as to substantially completely fill the recesses 313r by using a suitably designed deposition process 340, e.g., a CVD process and the like. Moreover, as described with respect to the illustrative embodiments depicted in FIGS. 2p-2r and described above, the dielectric cap layer 312 may be made up of a material that is substantially the same as that of the sidewall spacer structures 306, e.g., silicon nitride, thereby providing the appropriate etch selectivity with respect to the interlayer dielectric material 303 (see, FIG. 3j, described below).

Thereafter, an appropriate planarization process 341, such as a CMP process and the like, may be performed so as to remove the excess portions of the dielectric cap layer 313 from above the first layer portion 303a, and thereby forming dielectric cap elements 312a above the replacement metal gate structures 310r, as is shown in FIG. 3i. FIG. 3j schematically illustrates the semiconductor device 300 of FIG. 3i after several additional processing steps have been performed so as to form a second layer portion 303b of the interlayer dielectric material 303 above the first layer portion 303a. Furthermore, a patterned mask layer 325 may be formed above the second layer portion 303b so as to define the location of contact via openings 311. In certain embodiments, the second layer portion 303b may be made up of substantially the same material as that of the first layer portion 303a, such as, for example, silicon dioxide and the like. Accordingly, the requisite etch selectivity with respect to the dielectric cap elements 312a and the sidewall spacer structures 306 may be realized during a selective etch process 342 that is used to form the contact via openings 312 and to expose the source/drain regions 302d. Moreover, as previously described, in at least some illustrative embodiments the photoresist pattern of the mask layer 325 may be misaligned with the gate electrode pattern of the semiconductor device 300, thereby resulting in the contact via openings 311 expose at least a portion of the upper surfaces 310s of the replacement gate structures 310r. However, it should be appreciated by those of ordinary skill in the art having the benefit of the present disclosure that the presence of the dielectric cap elements 312a above the replacement gate structures 310r may facilitate the formation of self-aligned contact elements (not shown) that may substantially avoid the likelihood of creating a short between the electrodes 310r and the source/drain regions 302d.

As a result of the present subject matter, several illustrative techniques are disclosed for forming replacement metal gate structures based on the use of various material substitution processes. Furthermore, additional illustrative techniques are also disclosed for forming borderless or self-aligned contact elements to metal gate electrodes that substantially avoid the potential problem of creating electrical shorts between a gate electrode and the source and/or drain regions of a transistor device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   removing at least a dummy gate electrode to define a gate cavity;
   forming a work-function material in said gate cavity;
   forming a semiconductor material above said work-function material; and
   performing a material substitution process on said semiconductor material to substitute a replacement material for at least a portion of said semiconductor material.

2. The method of claim 1, wherein performing said material substitution process comprises forming a material layer comprising said replacement material above said semiconductor material and performing a heat treatment process.

3. The method of claim 1, wherein performing said material substitution process comprises exposing said semiconductor material to a gaseous treatment ambient comprising said replacement material.

4. The method of claim 1, wherein said semiconductor material comprises silicon and said replacement material comprises one of aluminum and tungsten.

5. A method, comprising:
   forming a gate structure above an active area of a transistor device, said gate structure comprising at least a dummy gate electrode and a dummy gate dielectric layer;
   forming a gate cavity in said gate structure by removing said dummy gate electrode and said dummy gate dielectric layer; and
   forming a replacement gate structure by forming a high-k dielectric material inside of said gate cavity and above a channel region of said transistor device, forming a work-function material above said high-k dielectric material, forming a semiconductor material above said work-function material, and performing a material substitution process on said semiconductor material to substitute a replacement metal gate electrode material for at least a portion of said semiconductor material formed inside of said gate cavity.

6. The method of claim 5, wherein performing said material substitution process comprises substantially completely replacing said semiconductor material formed inside of said gate cavity with said replacement metal gate electrode material.

7. The method of claim 5, wherein performing said material substitution process comprises forming a layer of said replacement metal gate electrode material above said semiconductor material and performing a heat treatment process.

8. The method of claim 7, wherein said semiconductor material comprises silicon and said replacement metal gate electrode material comprises aluminum.

9. The method of claim 5, wherein performing said material substitution process comprises exposing said semiconductor material to a gaseous treatment ambient comprising said replacement metal gate electrode material.

10. The method of claim 5, wherein said semiconductor material comprises silicon, said replacement metal gate electrode material comprising tungsten, and said gaseous treatment ambient comprises tungsten hexafluoride.

11. The method of claim 5, further comprising removing an upper portion of said replacement metal gate electrode material to form a recess in said replacement gate structure.

12. The method of claim 11, further comprising forming a dielectric cap layer in said recess.

13. The method of claim 12, further comprising forming a contact opening in an interlayer dielectric material formed above said transistor device, said contact opening exposing at least a portion of said dielectric cap layer and at least a portion of a contact region of said active area.

14. A method, comprising:
forming a semiconductor device comprising a gate structure, said gate structure comprising a dummy gate electrode, a dummy gate dielectric layer; and sidewall spacers adjacent to sidewalls of said dummy gate electrode;
selectively removing said dummy gate electrode and said dummy gate dielectric layer to form a gate cavity in said gate structure;
forming a high-k dielectric material inside of said gate cavity, said high-k dielectric material having a dielectric constant of approximately 10 or higher;
forming a work-function material inside of said gate cavity and above said high-k dielectric material;
forming a semiconductor material above said work-function material to fill a remaining portion of said gate cavity, said semiconductor material comprising silicon; and
performing a material substitution process on said semiconductor material to substitute a replacement gate electrode material for at least a portion of said semiconductor material formed in said gate cavity.

15. The method of claim 14, wherein performing said material substitution process comprises forming a metal layer comprising said replacement gate electrode material above said semiconductor material, forming a trapping material layer above said metal layer, and thereafter performing a heat treatment process.

16. The method of claim 15, wherein forming said metal layer comprises forming a material layer comprising aluminum.

17. The method of claim 15, wherein forming said trapping material layer comprises forming a material layer comprising titanium.

18. The method of claim 15, wherein performing said heat treatment process comprises forming an alloy metal region above said metal layer, said alloy metal region comprising an alloy of said semiconductor material and material comprising said trapping material layer.

19. The method of claim 14, wherein performing said material substitution process comprises exposing said semiconductor material to a gaseous treatment ambient.

20. The method of claim 19, wherein said gaseous treatment ambient comprises tungsten hexafluoride and said replacement gate electrode material comprises tungsten.

21. The method of claim 14, wherein forming said semiconductor device comprises forming an interlayer dielectric material above said gate structure and planarizing said interlayer dielectric material to expose said dummy gate electrode.

22. The method of claim 21, wherein forming at least one of said high-k dielectric material, said work-function material and said semiconductor material comprises forming an excess portion of said at least one of said high-k dielectric material, said work-function material and said semiconductor material outside of said gate cavity and above said interlayer dielectric material.

23. The method of claim 22, further comprising performing a planarization process to remove said excess portion of said at least one of said high-k dielectric material, said work-function material and said semiconductor material from above said interlayer dielectric material prior to performing said material substitution process.

24. The method of claim 23, further comprising removing an upper portion of said work-function material formed inside of said gate cavity after performing said planarization process and prior to performing said material substitution process.

25. The method of claim 23, further comprising forming a recess in said gate structure after performing said planarization process and prior to performing said material substitution process, wherein forming said recess comprises removing upper portions of said work-function material and said semiconductor material formed inside of said gate cavity.

26. The method of claim 25, further comprising forming a dielectric cap material in said recess.

27. The method of claim 26, further comprising forming a contact opening in said interlayer dielectric material to expose at least a portion of one of a source region and a drain region of said semiconductor device and at least a portion of said dielectric cap material formed in said recess.

* * * * *